US012666847B2

(12) United States Patent
Kim et al.

(10) Patent No.: US 12,666,847 B2
(45) Date of Patent: Jun. 23, 2026

(54) DISPLAY DEVICE AND METHOD OF MANUFACTURING THE SAME

(71) Applicant: Samsung Display Co., LTD., Yongin-si (KR)

(72) Inventors: Woongsik Kim, Seoul (KR); Jin-Su Byun, Seoul (KR); Sikwang Kim, Seongnam-si (KR); Donghwan Bae, Seoul (KR)

(73) Assignee: SAMSUNG DISPLAY CO., LTD, Yongin-si (KR)

( * ) Notice: Subject to any disclaimer, the term of this patent is extended or adjusted under 35 U.S.C. 154(b) by 488 days.

(21) Appl. No.: 18/314,285

(22) Filed: May 9, 2023

(65) Prior Publication Data

US 2024/0032394 A1 Jan. 25, 2024

(30) Foreign Application Priority Data

Jul. 21, 2022 (KR) ........................ 10-2022-0090462

(51) Int. Cl.
 *H10K 59/80* (2023.01)
 *G06F 3/041* (2006.01)
 (Continued)

(52) U.S. Cl.
 CPC ......... *H10K 59/873* (2023.02); *G06F 3/0412* (2013.01); *H10K 50/844* (2023.02);
 (Continued)

(58) Field of Classification Search
 CPC ........... H10K 59/8791; H10K 59/8792; H10K 50/86–865
 See application file for complete search history.

(56) References Cited

U.S. PATENT DOCUMENTS

| 8,213,082 B2 | 7/2012 | Gaides et al. |
| 11,910,695 B2 * | 2/2024 | Gao ..................... H10K 59/124 |

(Continued)

FOREIGN PATENT DOCUMENTS

| KR | 1020140087435 A * | 7/2014 | ........ H10K 59/1201 |
| KR | 1020180074165 A * | 7/2018 | ............. C23C 16/24 |

(Continued)

OTHER PUBLICATIONS

Machine translation, Kim, Korean Pat. Pub. No. KR102037051B1, translation date: Jan. 28, 2026, Espacenet, all pages. (Year: 2026).*

(Continued)

*Primary Examiner* — Victoria K. Hall
(74) *Attorney, Agent, or Firm* — F. CHAU & ASSOCIATES, LLC

(57) ABSTRACT

A display device includes a substrate including a display area and a pad area disposed outside a display area in plan view, a plurality of pixels disposed in a display area on a substrate, at least one display pad electrode disposed in a pad area on a substrate, a thin film encapsulation layer disposed on a display area on a substrate and covering the plurality of pixels, a protective film disposed on a thin film encapsulation layer and including an inorganic material, a light transmitting film disposed on a protective film and including a plurality of openings exposing a portion of a protective film, and a light blocking pattern that fills each of the plurality of openings and are disposed on a protective film.

20 Claims, 22 Drawing Sheets

(51) Int. Cl.

| | |
|---|---|
| *H10K 50/844* | (2023.01) |
| *H10K 50/86* | (2023.01) |
| *H10K 59/12* | (2023.01) |
| *H10K 59/126* | (2023.01) |
| *H10K 59/131* | (2023.01) |
| *H10K 71/00* | (2023.01) |
| *H10K 59/40* | (2023.01) |

(52) U.S. Cl.
CPC ....... *H10K 50/865* (2023.02); *H10K 59/1201* (2023.02); *H10K 59/126* (2023.02); *H10K 59/131* (2023.02); *H10K 59/875* (2023.02); *H10K 71/621* (2023.02); *G06F 3/04164* (2019.05); *G06F 2203/04103* (2013.01); *H10K 59/40* (2023.02)

(56) References Cited

U.S. PATENT DOCUMENTS

| | | | | | |
|---|---|---|---|---|---|
| 2013/0020704 | A1* | 1/2013 | Sadaka | ............... | H10W 74/134 |
| | | | | | 438/455 |
| 2020/0020885 | A1* | 1/2020 | Lee | ....................... | G06F 3/0412 |
| 2020/0168844 | A1* | 5/2020 | Kim | ..................... | H10K 59/352 |
| 2020/0321400 | A1* | 10/2020 | Park | ................... | H10K 59/8792 |
| 2021/0013455 | A1* | 1/2021 | Bae | ........................ | H10K 59/38 |
| 2021/0109617 | A1* | 4/2021 | Lin | ......................... | H10K 59/38 |
| 2021/0217831 | A1* | 7/2021 | Jung | .................... | H10K 59/873 |
| 2021/0226174 | A1* | 7/2021 | Kim | ....................... | H04N 23/57 |
| 2021/0391558 | A1* | 12/2021 | Kim | ....................... | H10K 59/40 |
| 2022/0052129 | A1* | 2/2022 | Kim | ..................... | H10K 59/122 |

FOREIGN PATENT DOCUMENTS

| | | |
|---|---|---|
| KR | 10-2009331 B1 | 8/2019 |
| KR | 10-2021-0092351 | 7/2021 |

OTHER PUBLICATIONS

Machine translation, Yoo, Korean Pat. Pub. No. KR20180074165A, translation date: Jan. 28, 2026, Espacenet, all pages. (Year: 2026).*
Korean Intellectual Property Office, Request for the Submission of an Opinion, Application No. 10-2022-0090462, Jan. 20, 2026 , all pages. (Year: 2026).*
Machine Translation of KR 10-2009331, 12 pages.

\* cited by examiner

FIG. 2
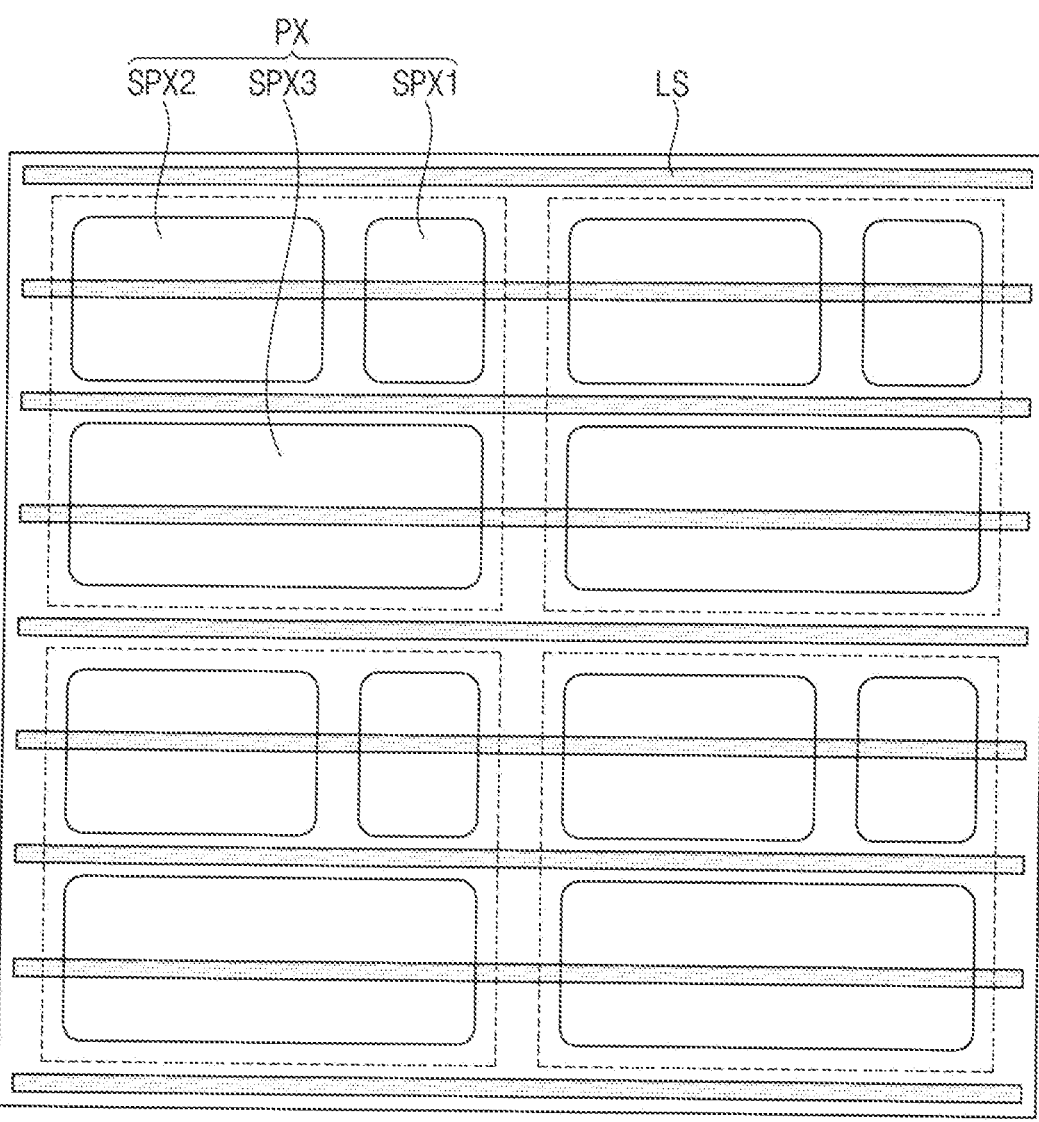
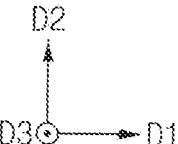

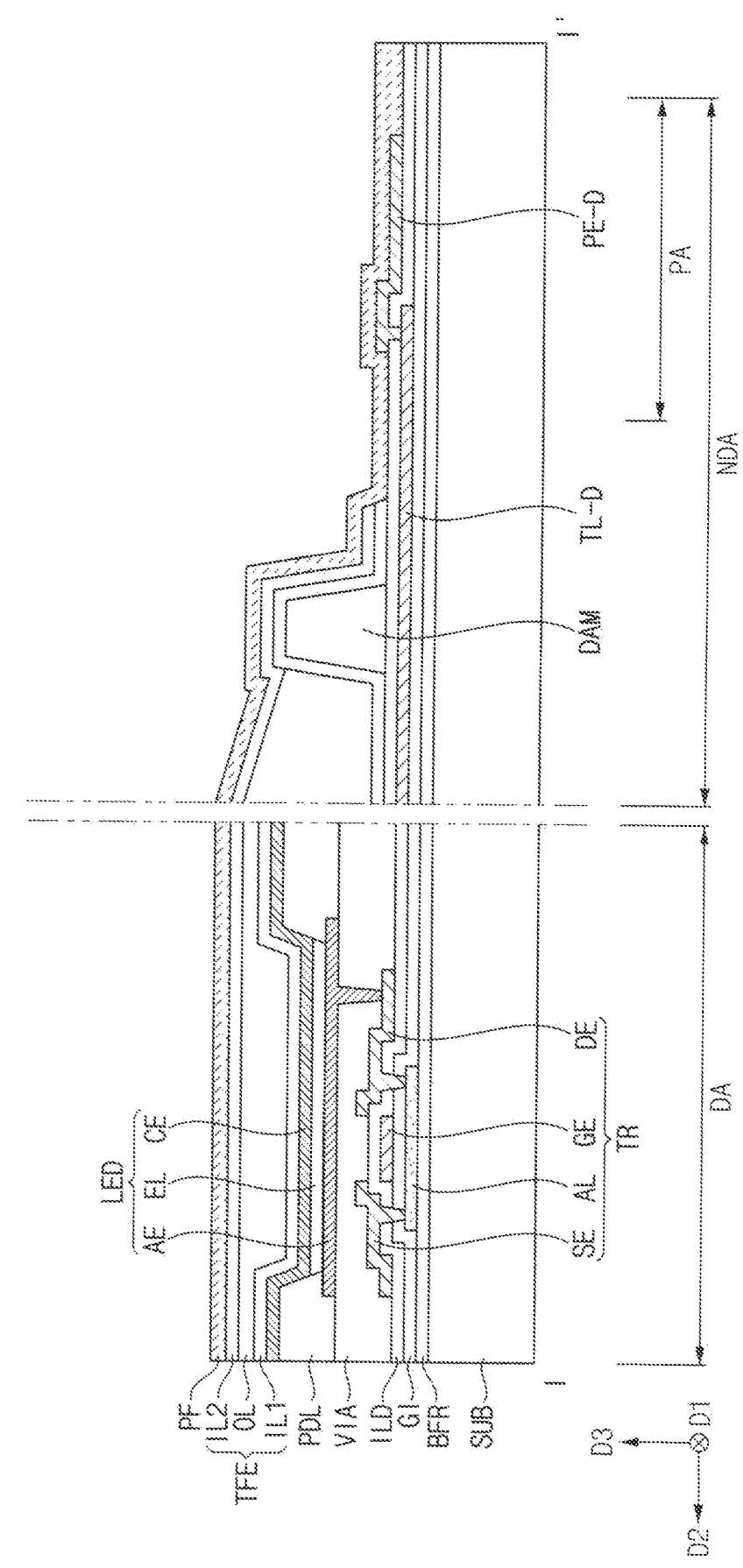
F I G . 5

F I G . 1 4
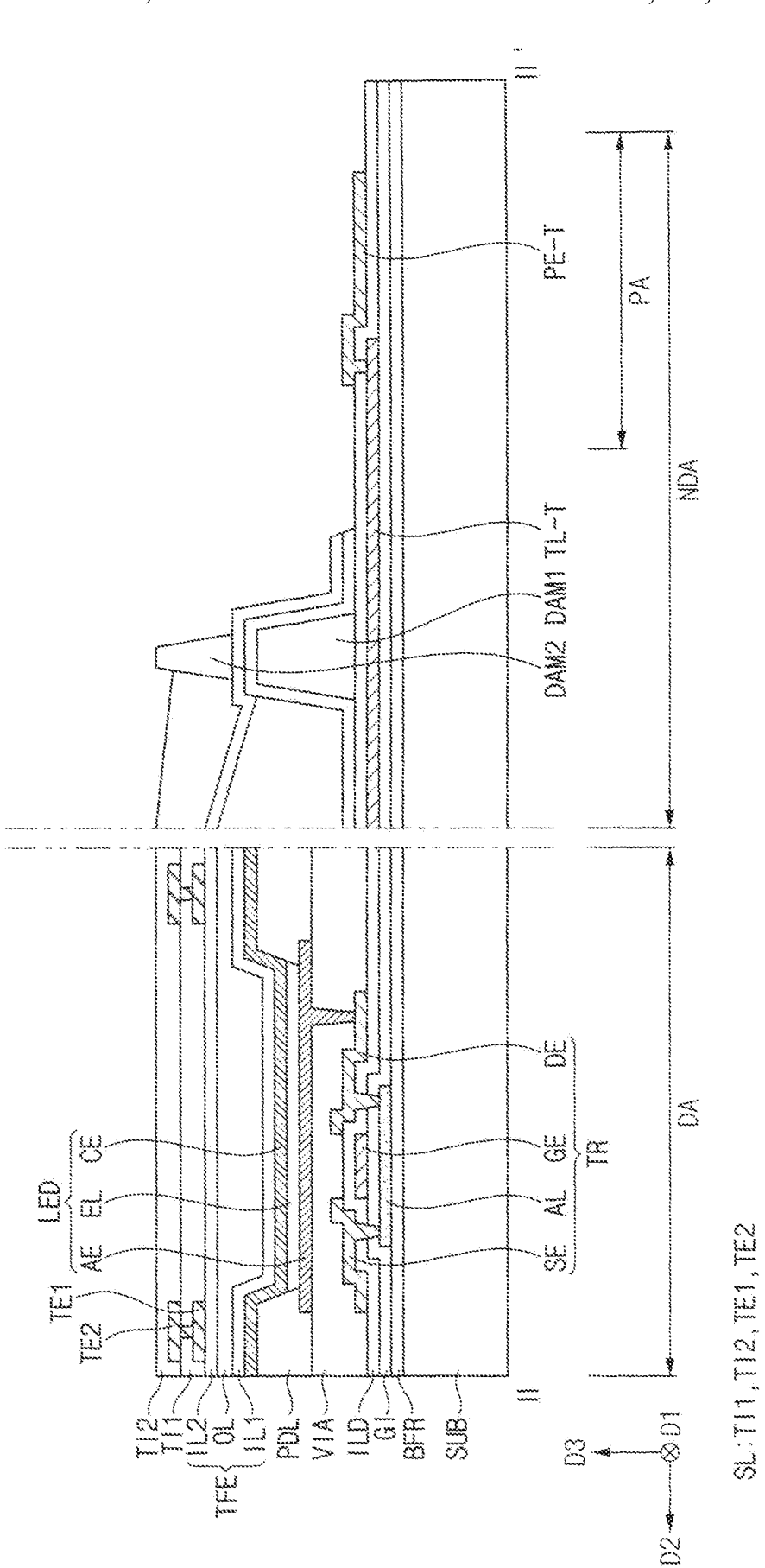

FIG. 17

F I G. 18
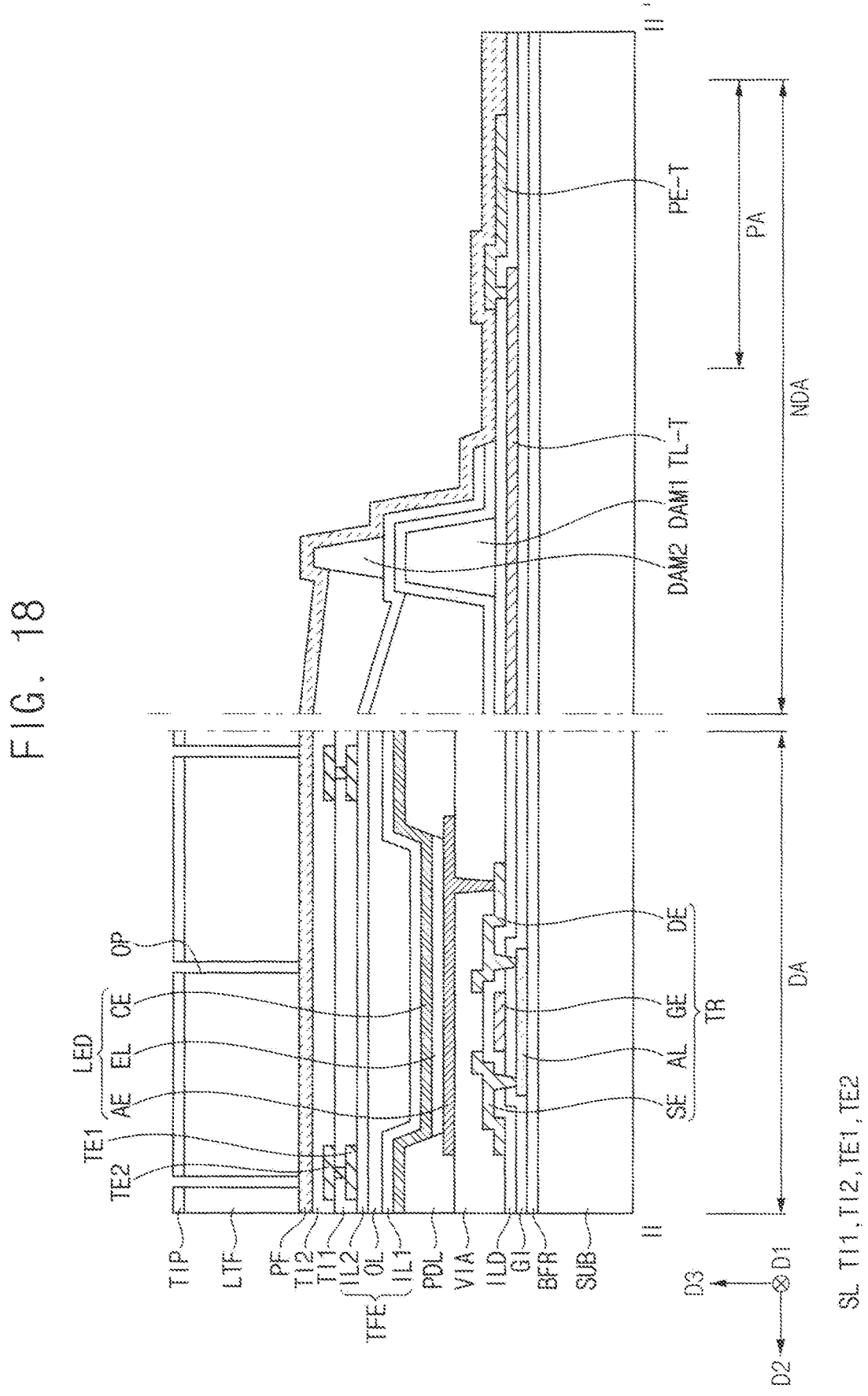

FIG. 22
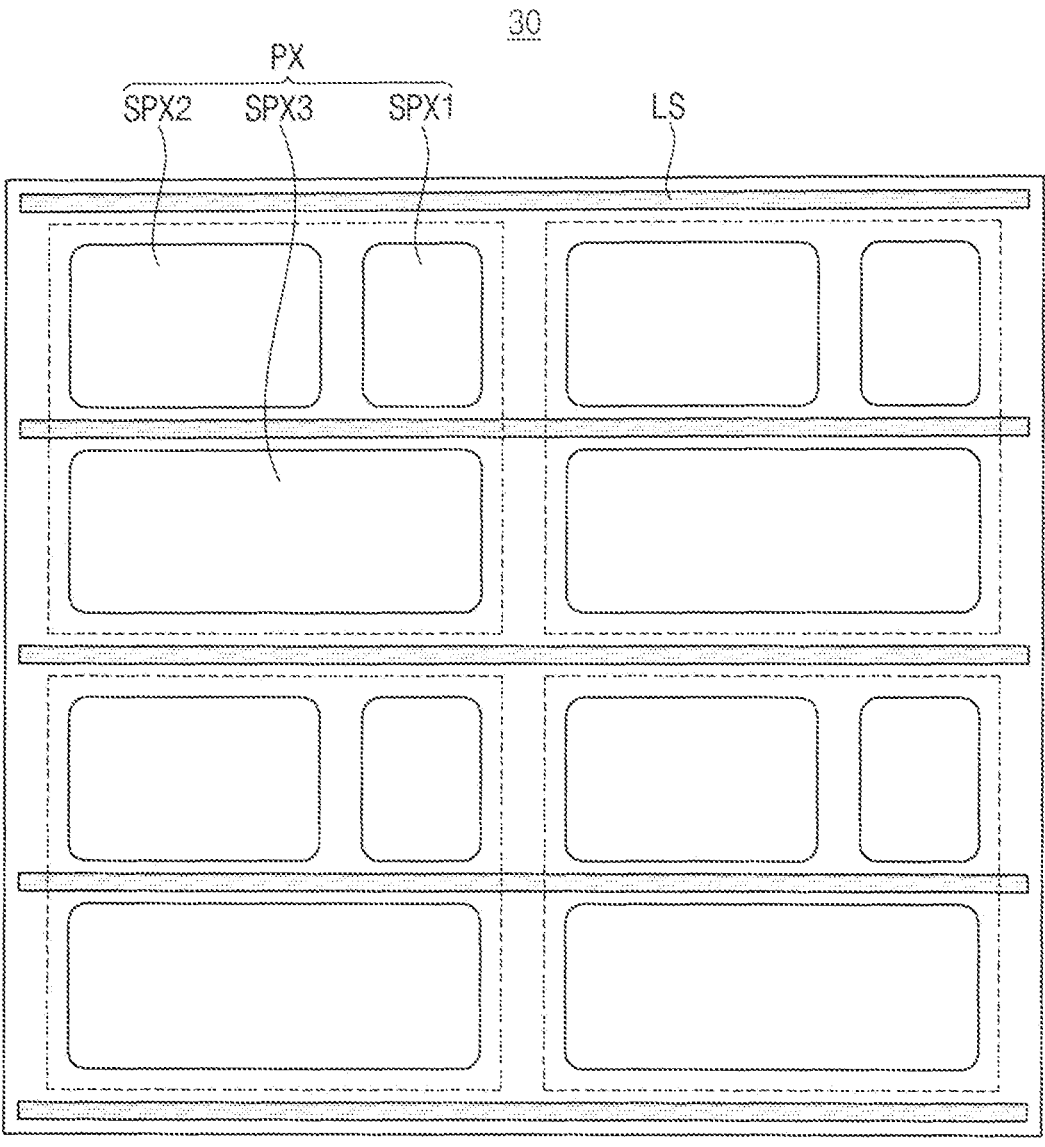
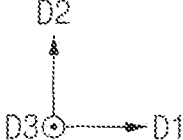

DISPLAY DEVICE AND METHOD OF MANUFACTURING THE SAME

CROSS-REFERENCE TO RELATED APPLICATION(S)

This application claims priority to and benefits of Korean Patent Application No. 10-2022-0090462 under 35 U.S.C. § 119, filed on Jul. 21, 2022 in the Korean Intellectual Property Office (KIPO), the entire contents of which are herein incorporated by reference.

BACKGROUND

1. Technical Field

Embodiments relate to a display device and method of manufacturing the display device.

2. Description of the Related Art

A flat panel display is being used as a display device and has generally replaced the cathode ray tube display due to characteristics such as light weight and thinness. Representative examples of such flat panel display devices include a liquid crystal display device and an organic light emitting display device.

The display device may include a display panel including pixels to generate an image, and a circuit board to provide a driving signal to the display panel. The circuit board may be electrically connected to pad electrodes of the display panel. When the pad electrodes are damaged, reliability of the display device may be reduced.

SUMMARY

Embodiments provide a display device with improved reliability.

Embodiments provide a method of manufacturing the display device with improved reliability.

A display device according to an embodiment may include a substrate including a display area and a pad area disposed outside the display area in plan view, a plurality of pixels disposed in the display area on the substrate, at least one display pad electrode disposed in the pad area on the substrate, a thin film encapsulation layer disposed on the display area on the substrate and covering the plurality of pixels, a protective film disposed on the thin film encapsulation layer and including an inorganic material, a light transmitting film disposed on the protective film and including a plurality of openings exposing a portion of the protective film, and a light blocking pattern that fills each of the plurality of openings and are disposed on the protective film.

In an embodiment, an etch rate of the protective film may be lower than an etch rate of the light transmitting film in a same etching process.

In an embodiment, the protective film may include at least one of silicon oxide, silicon nitride, and silicon oxynitride.

In an embodiment, each of the plurality of pixels may include a plurality of sub pixels, and the light blocking patterns may be spaced apart from the plurality of sub pixels in plan view.

In an embodiment, the display device may further include a transparent inorganic film pattern disposed in the display area on the light transmitting film and spaced apart from the plurality of openings in plan view.

In an embodiment, the display device may further include a sensing layer disposed between the thin film encapsulation layer and the protective film and including at least one touch electrode and at least one touch pad electrode disposed in the pad area on the substrate.

A method of manufacturing a display device according to an embodiment may include forming a pixel in a display area on a substrate and at least one display pad electrode in a pad area disposed outside the display area in plan view, forming a thin film encapsulation layer covering the pixel in the display area on the substrate, forming a protective film including an inorganic material and covering the thin film encapsulation layer and the display pad electrode on the display area and the pad area on the substrate, forming a light transmitting film including a plurality of openings exposing a portion of the protective film in the display area on the protective film, and forming a light blocking pattern disposed in each of the plurality of openings.

In an embodiment, the forming of the light transmitting film may include forming a preliminary light transmitting film on the display area on the protective film, forming a transparent inorganic film pattern on the preliminary light transmitting film, forming a metal pattern covering an upper surface of the transparent inorganic film pattern and an upper surface of the protective film in the display area and the pad area on the substrate, and forming the plurality of openings by etching the preliminary light transmitting film using the transparent inorganic film pattern and the metal pattern as a mask.

In an embodiment, in the etching the preliminary light transmitting film, the protective film may have a first etch rate and the preliminary light transmitting film may have a second etch rate, and the second etch rate may be higher than the first etch rate.

In an embodiment, the protective film may include at least one of silicon oxide, silicon nitride, and silicon oxynitride.

In an embodiment, after forming the plurality of openings, the metal pattern may be removed.

In an embodiment, after forming the light blocking pattern, the protective film in the pad area may be selectively removed to expose the display pad electrode.

In an embodiment, the protective film in the pad area may be selectively removed by a whole surface etching process.

A method of manufacturing a display device according to another embodiment may include forming a pixel in a display area on a substrate and at least one display pad electrode in a pad area disposed outside the display area in plan view, forming a thin film encapsulation layer covering the pixel in the display area on the substrate, forming a sensing layer including at least one sensing electrode in the display area on the thin film encapsulation layer and at least one touch pad electrode disposed in the pad area, forming a protective film including an inorganic material and covering the sensing layer, the display pad electrode, and the touch pad electrode on the display area and the pad area on the substrate, forming a light transmitting film including a plurality of openings exposing a portion of the protective film in the display area on the protective film, and forming a light blocking pattern disposed in each of the plurality of openings.

In an embodiment, the forming of the light transmitting film may include forming a preliminary light transmitting film on the display area on the protective film, forming a transparent inorganic film pattern on the preliminary light transmitting film, forming a metal pattern covering an upper surface of the transparent inorganic film pattern and an upper surface of the protective film in the display area and the pad area on the substrate, and forming the plurality of openings by etching the preliminary light transmitting film using the transparent inorganic film pattern and the metal pattern as a mask.

In an embodiment, in the etching the preliminary light transmitting film, the protective film may have a first etch rate and the preliminary light transmitting film may have a second etch rate, and the second etch rate may be higher than the first etch rate.

In an embodiment, the protective film may include at least of silicon oxide, silicon nitride, and silicon oxynitride.

In an embodiment, after forming the plurality of openings, the metal pattern may be removed.

In an embodiment, after forming the light blocking pattern, the protective film in the pad area may be selectively removed to expose the display pad electrode and the touch pad electrode.

In an embodiment, the protective film in the pad area may be selectively removed by a whole surface etching process.

According to the method of manufacturing the display device according to the disclosure, the light blocking patterns for controlling the viewing angle may be internalized in the display panel. Accordingly, power consumption of the display panel may be reduced, a thickness of the display panel may be reduced, and a manufacturing cost of the display panel may be reduced.

Also, in case that the light transmitting film is formed using an etching process to internalize the light blocking patterns in the display panel, the pad electrodes may be covered by the protective film. Accordingly, damage to the pad electrodes due to the etching process may be prevented. Accordingly, the reliability of the display device may be improved.

It is to be understood that both the foregoing general description and the following detailed description are only illustrative and explanatory and are intended to provide further explanation of the disclosure.

BRIEF DESCRIPTION OF THE DRAWINGS

Illustrative, non-limiting embodiments will be more clearly understood from the following detailed description taken in conjunction with the accompanying drawings.

FIG. 2 is a schematic plan view illustrating an arrangement of pixels of the display device of FIG. 1.

FIG. 3 is a schematic cross-sectional view taken along line I-I' of FIG. 1 is.

FIGS. 4 to 11 are schematic cross-sectional views illustrating an example of a method of manufacturing the display device of FIG. 1.

FIG. 13 is a schematic cross-sectional view taken along line II-If of FIG. 12.

FIGS. 14 to 21 are schematic cross-sectional views illustrating an example of a method of manufacturing the display device of FIG. 12.

FIG. 22 is a schematic plan view illustrating pixels of a display device according to still another embodiment.

DETAILED DESCRIPTION OF THE EMBODIMENTS

Figure 1:
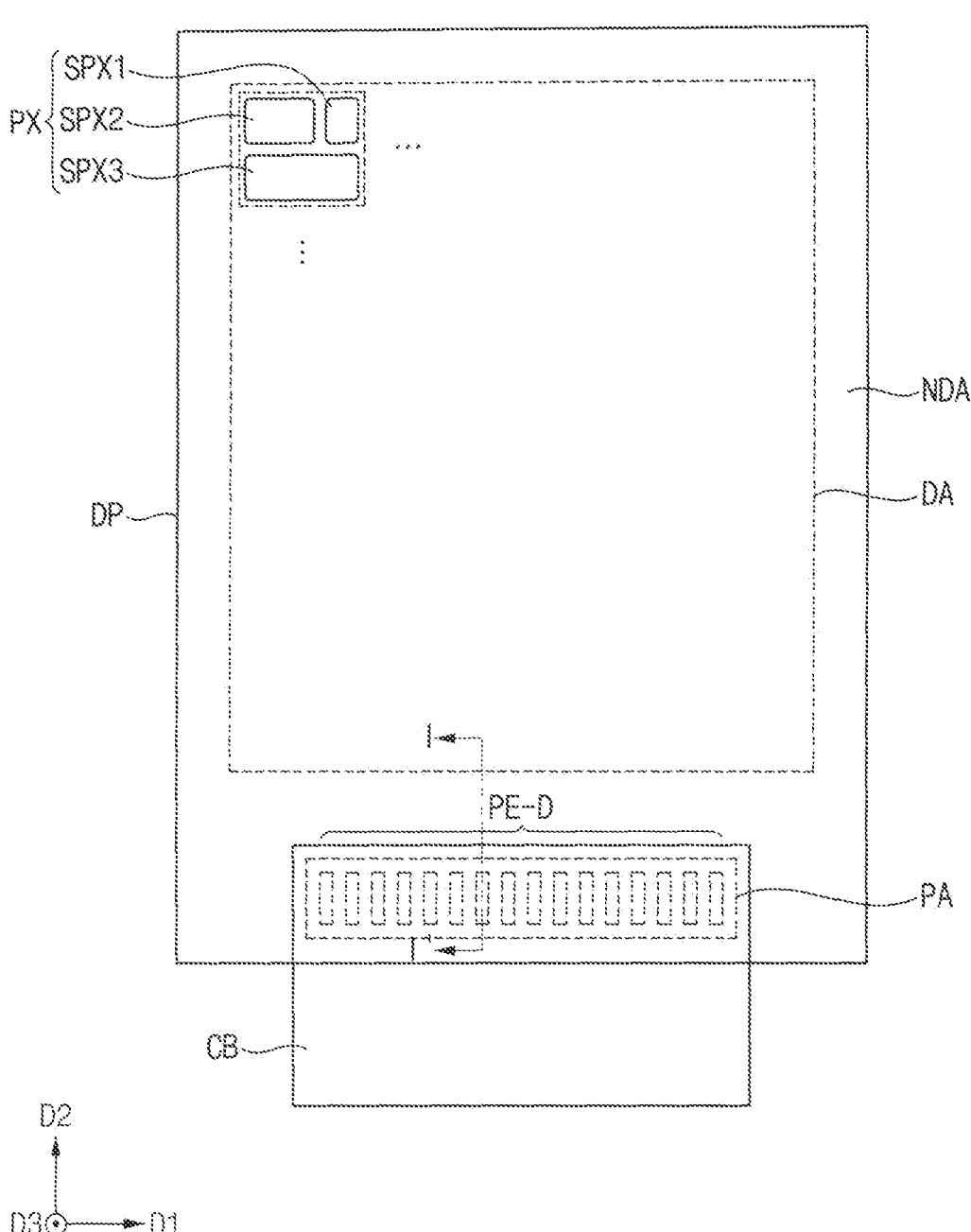
FIG. 1 is a schematic plan view illustrating a display device according to an embodiment.

The disclosure now will be described more fully hereinafter with reference to the accompanying drawings, in which various embodiments are shown. This disclosure may, however, be embodied in many different forms, and should not be construed as limited to the embodiments set forth herein. Rather, these embodiments are provided so that this disclosure will be thorough and complete, and will fully convey the scope of the disclosure to those skilled in the art. Like reference numerals refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

When an element is described as being "on" another element, it can be directly on the other element, or intervening elements (e.g., layers) may be present.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view illustrating a display device according to an embodiment.

Referring to FIG. 1, a display device 10 according to an embodiment may include a display panel DP and a circuit board CB.

The display panel DP may have a rectangular planar shape. For example, the display panel DP may have a rectangular planar shape having a short side in the first direction D1 and a long side in the second direction D2 perpendicular to the first direction D1. An edge where the short side and the long side meet may be formed at a right angle or have a predetermined or given curvature. However, the disclosure is not necessarily limited thereto, and the display panel DP may have a planar shape other than a rectangle, such as a polygon, a circle, an oval, or the like.

The display panel DP may generate an image. The display panel DP may include pixels PX for generating the image. Each of the pixels PX may include first to third sub pixels SPX1, SPX2, and SPX3. In an embodiment, the first sub pixel SPX1 may be a red sub pixel emitting red light, the second sub pixel SPX2 may be a green sub pixel emitting green light, and the third sub pixel SPX3 may be a blue sub pixel emitting blue light. However, the color of the light emitted by the first to third sub pixels SPX1, SPX2, and SPX3 is not limited thereto. Also, although it is illustrated that the number of sub pixels included in each of the pixels PX is three in FIG. 1, the disclosure is not limited thereto. For example, each of the pixels PX may further include a fourth sub-pixel emitting white light.

Each of the first to third sub pixels SPX1, SPX2, and SPX3 may include at least one thin film transistor and a light emitting device. The image may be generated by combining light emitted from each of the first to third sub pixels SPX1, SPX2, and SPX3. For example, the display panel DP may provide the generated image in a third direction D3.

The display panel DP may include a display area DA and a non-display area NDA. Pixels PX may be disposed in the display area DA. The non-display area NDA may be positioned outside the display area DA. For example, the non-display area NDA may surround the display area DA in plan view.

The non-display area NDA may include a pad area PA in which display pad electrodes PE-D are disposed. The pad area PA may be positioned outside the display area DA. Although only one pad area PA is illustrated in FIG. 1, the non-display area NDA may include multiple pad areas PA.

The circuit board CB may be attached to one side of the display panel DP. For example, the circuit board CB may be attached to the display panel DP so that an end overlaps the pad area PA. The circuit board CB may be electrically connected to the display pad electrodes PE-D through a conductive film. For example, the circuit board CB may be attached to the display panel DP by an anisotropic conductive film (ACF) and may be electrically connected to the display pad electrodes PE-D.

In an embodiment, the circuit board CB may be a flexible printed circuit board (FPCB). A printed circuit board (PCB) (not shown) may be attached to another end of the circuit board CB.

In an embodiment, the display device 10 may further include a driving circuit chip (not shown). The driving circuit chip may be mounted on (e.g., directly mounted on) the display panel DP using a chip on plastic (COP) method or a chip on glass (COG) method, or may be mounted on the circuit board CB attached to the display panel DP using a chip on film (COF) method.

The circuit board CB, the printed circuit board, and the driving circuit chip may provide a driving signal to the display panel DP. The driving signal may refer to various signals for driving the display panel DP, such as a driving voltage, a gate signal, and/or a data signal.

In an embodiment, the display panel DP may be a flexible display panel. In another embodiment, the display panel DP may be a rigid display panel.

In case that the display panel DP is a flexible display panel, the non-display area NDA may include a bending area (not shown). For example, the bending area may be positioned between the display area DA and the pad area PA. For example, the bending area of the display panel DP may be bent such that the pad area PA is positioned below the display area DA. Accordingly, dead space (accommodation space) of the display device 10 may be reduced.

FIG. 2 is a schematic plan view illustrating an arrangement of pixels of the display device of FIG. 1. Specifically, FIG. 2 is a plan view illustrating four pixels PX arranged in two rows and two columns among multiple pixels PX of the display device 10.

Referring to FIGS. 1 and 2, according to an embodiment, a size of the third sub pixel SPX3 in plan view may be larger than a size of the first sub pixel SPX1 in plan view and a size of the second sub pixel SPX2 in plan view. The size of the second sub pixel SPX2 in plan view may be greater than the size of the first sub pixel SPX1 in pan view. However, the disclosure is not necessarily limited thereto.

In an embodiment, when viewed from the third direction D3 (e.g., looking down from above the structure in the third direction D3), each of the first sub pixel SPX1 and the second sub pixel SPX2 may be disposed on a side of each of the pixels PX, the third sub pixel SPX3 may be disposed on another side of each of the pixels PX. For example, when viewed in the third direction D3, the first sub pixel SPX1 may be disposed on the upper right side of each of the pixels PX, the second sub pixel SPX2 may be disposed on the upper left side of each of the pixels PX, the third sub-pixel SPX3 may be disposed on the lower side of each of the pixels PX. However, the disclosure is not necessarily limited thereto.

The display panel DP may include light blocking patterns LS that extend in the first direction D1 and are spaced apart from each other in the second direction D2. In other words, each of the light blocking patterns LS may be disposed in parallel with a side of each of the first to third sub pixels SPX1, SPX2, and SPX3. In an embodiment, some of the light blocking patterns LS may be disposed to overlap the first to third sub pixels SPX1, SPX2, and SPX3 in plan view, and others of the light blocking patterns LS may be disposed to be spaced apart from the first to third sub pixels SPX1, SPX2, and SPX3 in plan view. The light blocking patterns LS may limit the light emission angle of each of the first to third sub pixels SPX1, SPX2, and SPX3. Accordingly, the viewing angle of the display device 10 may be controlled.

Figure 3:
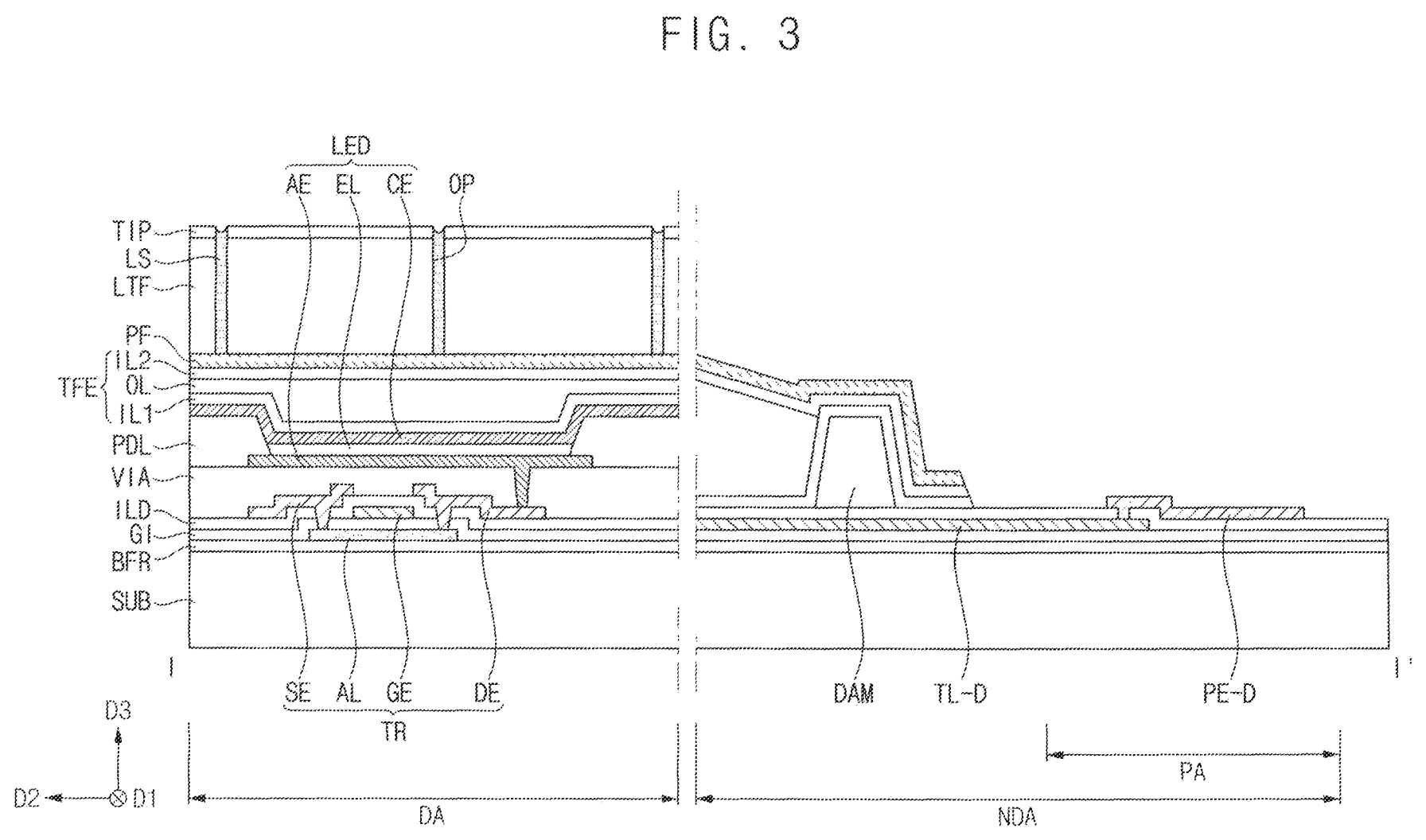

FIG. 3 is a schematic cross-sectional view taken along line I-I' of FIG. 1.

Referring to FIGS. 1 to 3, in an embodiment, the display panel DP may include a substrate SUB, a buffer layer BFR, a thin film transistor TR, a light emitting device LED, a thin film encapsulation layer TFE, a protective film PF, a light transmitting film LTF, a transparent inorganic film pattern TIP, the light blocking pattern LS, a display transmission line TL-D, and the display pad electrode PE-D. The thin film transistor TR and the light emitting device LED may be disposed in the display area DA on the substrate SUB. The thin film transistor TR may include an active layer AL, a gate electrode GE, a source electrode SE, and a drain electrode DE. The light emitting device LED may include an anode electrode AE, an emission layer EL, and a cathode electrode CE. The display pad electrode PE-D may be disposed in the pad area PA on the substrate SUB.

The substrate SUB may be an insulating substrate formed of a transparent or opaque material. In an embodiment, the substrate SUB may include glass. The display panel DP may be a rigid display panel. In another embodiment, the substrate SUB may include plastic. The display panel DP may be a flexible display panel.

The buffer layer BFR may be disposed on the substrate SUB. The buffer layer BFR may prevent impurities from diffusing from the substrate SUB to the active layer AL. The buffer layer BFR may include an inorganic insulating material such as a silicon compound or a metal oxide. Examples of the inorganic insulating material that can be used for the buffer layer BFR may include silicon oxide (SiO), silicon nitride (SiN), silicon oxynitride (SiON), silicon oxycarbide (SiOC), silicon carbonitride (SiCN), aluminum oxide. (AlO), aluminum nitride (AlN), tantalum oxide (TaO), hafnium oxide (HfO), zirconium oxide (ZrO), titanium oxide (TiO), or the like. These may be used alone or in combination with each other. The buffer layer BFR may have a single-layer structure or a multi-layer structure including multiple insulating layers. In an embodiment, the buffer layer BFR may be entirely disposed in the display area DA and the non-display area NDA on the substrate SUB.

The active layer AL may be disposed on the buffer layer BFR. The active layer AL may include an oxide semiconductor, a silicon semiconductor, an organic semiconductor, or the like. For example, the oxide semiconductor may include indium (In), gallium (Ga), tin (Sn), zirconium (Zr), vanadium (V), hafnium (Hf), cadmium (Cd), germanium (Ge), and/or chromium. The oxide semiconductor may include at least one oxide of (Cr), titanium (Ti), and zinc (Zn). The silicon semiconductor may include amorphous silicon, polycrystalline silicon, or the like. The active layer AL may include a source area, a drain area, and a channel area positioned between the source area and the drain area.

A gate insulating layer GI may be disposed on the active layer AL. The gate insulating layer GI may cover the active layer AL on the buffer layer BFR. In an embodiment, the gate insulating layer GI may be entirely disposed in the display area DA and the non-display area NDA on the buffer layer BFR. The gate insulating layer GI may include an inorganic insulating material The gate electrode GE may be disposed on the gate insulating layer GI. The gate electrode GE may overlap the channel area of the active layer AL. The gate electrode GE may include a conductive material such as a metal, an alloy, a conductive metal nitride, a conductive metal oxide, and/or a transparent conductive material. Examples of the conductive material that may be used for the gate electrode GE may include gold (Au), silver (Ag), aluminum (Al), platinum (Pt), nickel (Ni), titanium (Ti), and palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), alloy containing aluminum, alloy containing silver, alloy containing copper, alloy containing molybdenum, aluminum nitride (AlN), tungsten nitride (WN), titanium nitride (TiN), chromium nitride (CrN), tantalum nitride (TaN), strontium ruthenium oxide (SrRuO), zinc oxide (ZnO), indium tin oxide (ITO), tin oxide (SnO), indium oxide (InO), gallium oxide (GaO), indium zinc oxide (IZO), and the like. These may be used alone or in combination with each other. The gate electrode GE may have a single-layer structure or a multi-layer structure including multiple conductive layers.

An interlayer insulating layer ILD may be disposed on the gate electrode GE. The interlayer insulating layer ILD may cover the gate electrode GE on the gate insulating layer GI. In an embodiment, the interlayer insulating layer ILD may be entirely disposed in the display area DA and the non-display area NDA on the gate insulating layer GI. The interlayer insulating layer ILD may include an inorganic insulating material.

The source electrode SE and the drain electrode DE may be disposed on the interlayer insulating layer ILD. The source electrode SE may be connected to the source area and the drain electrode DE may be connected to the drain area of the active layer AL. Each of the source electrode SE and the drain electrode DE may include a conductive material. The active layer AL, the gate electrode GE, the source electrode SE, and the drain electrode DE may form the thin film transistor TR.

A via insulating layer VIA may be disposed on the source electrode SE and the drain electrode DE. The via insulating layer VIA may include an organic insulating material. Examples of the organic insulating material that can be used for the via insulating layer VIA may include photoresist, polyacryl-based resin, polyimide-based resin, polyamide-based resin, siloxane-based resin, acryl-based resin, epoxy-based resin, and the like. These may be used alone or in combination with each other. In an embodiment, the via insulating layer VIA may be disposed in the display area DA on the interlayer insulating layer ILD.

The anode electrode AE may be disposed on the via insulating layer VIA. The anode electrode AE may include a conductive material. The anode electrode AE may be connected to the drain electrode DE through a contact hole formed in the via insulating layer VIA. Accordingly, the anode electrode AE may be electrically connected to the thin film transistor TR.

A pixel defining layer PDL may be disposed on the anode electrode AE. The pixel defining layer PDL may cover a peripheral portion of the anode electrode AE and define a pixel opening exposing a central portion of the anode electrode AE. The pixel defining layer PDL may include an organic insulating material. In an embodiment, the pixel defining layer PDL may be disposed in the display area DA on the via insulating layer VIA.

The emission layer EL may be disposed on the anode electrode AE. The emission layer EL may be disposed in the pixel opening of the pixel defining layer PDL. The emission layer EL may include at least one of an organic light emitting material and quantum dots.

In an embodiment, the organic light emitting material may include a low molecular weight organic compound or a high molecular weight organic compound. Examples of the low molecular weight organic compound may include copper phthalocyanine, diphenylbenzidine (N,N'-diphenylbenzidine), tris-(8-hydroxyquinoline)aluminum, and the like. Examples of the polymer organic compound may include polyethylenedioxythiophene (poly(3,4-ethylenedioxythiophene), polyaniline, poly-phenylenevinylene, polyfluorene, etc. These may be used alone or in combination with each other.

In an embodiment, the quantum dots may include a core including a group II-VI compound, a group III-V compound, a group IV-VI compound, a group IV element, a group IV compound, and combinations thereof. In an embodiment, the quantum dots may have a core-shell structure including the core and a shell surrounding the core. The shell may serve as a protective layer for maintaining semiconductor properties by preventing chemical modification of the core and as a charging layer for imparting electrophoretic properties to the quantum dots.

The cathode electrode CE may be disposed on the emission layer EL. The cathode electrode CE may also be disposed on the pixel defining layer PDL. The cathode electrode CE may include a conductive material. In an embodiment, between the anode electrode AE and the cathode electrode CE, various light emitting functional layers such as a hole injection layer (HIL), a hole transporting layer (HTL), an electron transporting layer (ETL), an electron injection layer (EIL) may be disposed. The anode electrode AE, the emission layer EL, and the cathode electrode CE may form a light emitting device LED.

The thin film encapsulation layer TFE may be disposed on the cathode electrode CE. The thin film encapsulation layer TFE may cover the light emitting device LED. The thin film encapsulation layer TFE may encapsulate the display area DA to protect the light emitting device LED from external impurities.

The thin film encapsulation layer TFE may include at least one inorganic encapsulation layer and at least one organic encapsulation layer. In an embodiment, the thin film encapsulation layer TFE may include a first inorganic encapsulation layer IL1 disposed on the cathode electrode CE, an organic encapsulation layer OL disposed on the first inorganic encapsulation layer ILL and a second inorganic encapsulation layer IL2 disposed on the organic encapsulation layer OL.

Each of the first inorganic encapsulation layer IL1 and the second inorganic encapsulation layer IL2 may include an inorganic insulating material. For example, each of the first inorganic encapsulation layer IL1 and the second inorganic encapsulation layer IL2 may include a silicon compound such as silicon oxide, silicon nitride, and/or silicon oxynitride.

The organic encapsulation layer OL may include an organic insulating material. For example, the organic encapsulation layer OL may be formed by an inkjet method for discharging an ink or a solution containing an organic material.

In an embodiment, the display panel DP may further include a dam part DAM disposed in the non-display area NDA on the substrate SUB. The dam part DAM may be disposed in the non-display area NDA between the display area DA and the pad area PA. In case that the organic encapsulation layer OL is formed by an inkjet method for discharging ink or a solution containing an organic material, the dam portion DAM may prevent the organic material from overflowing in the edge direction of the substrate SUB (e.g., the right direction in FIG. 3). For example, the dam part DAM may have a shape surrounding the display area DA in plan view. In an embodiment, the dam part DAM may be formed simultaneously with the pixel defining layer PDL, but the disclosure is not limited thereto. Also, although only one dam part DAM which is a single layer is illustrated in FIG. 3, the disclosure is not limited thereto. For example, the dam part DAM may have a multilayer structure. The display panel DP may include multiple dam parts DAM.

In an embodiment, each of the first inorganic encapsulation layer IL1 and the second inorganic encapsulation layer IL2 may extend from the display area DA to an area between the display area DA and the pad area PA (e.g., a portion of the non-display area NDA adjacent to the display area DA). In an embodiment, each of the first inorganic encapsulation layer IL1 and the second inorganic encapsulation layer IL2 may cover the dam part DAM. Each of the first inorganic encapsulation layer IL1 and the second inorganic encapsulation layer IL2 may be spaced apart from the pad area PA. In other words, an end of the first inorganic encapsulation layer IL1 adjacent to the pad area PA and an end of the second inorganic encapsulation layer IL2 adjacent to the pad area PA may be positioned between the dam part DAM and the pad area PA, respectively. For example, the end of the first inorganic encapsulation layer IL1 adjacent to the pad area PA and the end of the second inorganic encapsulation layer IL2 adjacent to the pad area PA may be positioned at a boundary of the pad area PA, respectively.

The protective film PF may be disposed on the thin film encapsulation layer TFE. In an embodiment, the protective film PF may extend from the display area DA to an area between the display area DA and the pad area PA (e.g., a portion of the non-display area NDA adjacent to the display area DA). In an embodiment, the protective film PF may cover the dam part DAM. Also, the protective film PF may be spaced apart from the pad area PA. In other words, an end of the protective film PF adjacent to the pad area PA may be positioned between the dam part DAM and the pad area PA. For example, the end of the protective film PF adjacent to the pad area PA may be positioned at a boundary of the pad area PA.

In an embodiment, the protective film PF may include an inorganic material. Examples of the inorganic material that can be used for the protective film PF may include silicon oxide (SiO), silicon nitride (SiN), silicon oxynitride (SiON), and the like. These may be used alone or in combination with each other. Specifically, the protective film PF may include silicon nitride (SiN). The protective film PF may have a single-layer structure or a multi-layer structure including multiple insulating layers.

The light transmitting film LTF may be disposed on the protective film PF. In an embodiment, the light transmitting film LTF may include an organic insulating material. Examples of the organic insulating material that can be used for the light transmitting film LTF may include photoresist, polyacryl-based resin, polyimide-based resin, polyamide-based resin, a siloxane-based resin, an acryl-based resin, an epoxy-based resin, and the like. These may be used alone or in combination with each other. The light transmitting film LTF may transmit light emitted from each of the first to third sub pixels SPX1, SPX2, and SPX3.

In an embodiment, the light transmitting film LTF may define multiple openings OP. The openings OP may expose a portion of the protective film PF. For example, the openings OP may be formed by forming a transparent inorganic film pattern TIP on a preliminary light transmitting film, and etching the preliminary light transmitting film using the transparent inorganic film pattern TIP as a mask. In other words, the preliminary light transmitting film may be etched according to a shape of the transparent inorganic film pattern TIP. Accordingly, each of the openings OP may overlap gaps within the transparent inorganic film pattern TIP in cross-sectional view. This will be described in more detail later with reference to FIGS. 6 and 7.

In an embodiment, for a same etching process, an etch rate of the protective film PF may be lower than an etch rate of the preliminary light transmitting film. In other words, the etch rate of the protective film PF may be lower than the etch rate of the light transmitting film LTF. For example, for the process of forming the openings OP by etching the preliminary light transmitting film using the transparent inorganic film pattern TIP as a mask, the etch rate of the protective film PF may be lower than the etch rate of the preliminary light transmitting film.

The transparent inorganic film pattern TIP may be disposed on the light transmitting film LTF. The transparent inorganic film pattern TIP may transmit light emitted from each of the first to third sub pixels SPX1, SPX2, and SPX3 together with the light transmitting film LTF. Examples of the material that can be used for the transparent inorganic film pattern TIP may include indium tin oxide (ITO), indium zinc oxide (IZO), and the like. These may be used alone or in combination with each other. As described above, the transparent inorganic film pattern TIP may be used as a mask in the process of forming the openings OP by etching the light transmitting film LTF. Accordingly, the transparent inorganic film pattern TIP may be disposed to be spaced apart by the openings OP in plan view.

The light blocking patterns LS may be disposed on the protective film PF. Each of the light blocking patterns LS may be disposed to fill the openings OP. In other words, the light transmitting film LTF may function as a mold for determining each of the light blocking patterns LS. Accordingly, each of the light blocking patterns LS may be surrounded by the light transmitting film LTF in plan view. In other words, side surfaces of each of the light blocking patterns LS may face a side surface of the light transmitting film LTF.

In an embodiment, an upper end of each of the light blocking patterns LS may be disposed on the same plane as an upper end of the transparent inorganic film pattern TIP. In other words, in the process of forming the light blocking patterns LS, portions formed higher than the transparent inorganic film pattern TIP may be removed. For example, the upper end of each of the light blocking patterns LS may be planarized based on the upper end of the transparent inorganic film pattern TIP through a polishing process. Examples of the polishing process may include a chemical mechanical polishing process, but the disclosure is not limited thereto. This will be described in more detail later with reference to FIGS. 9 and 10. In an embodiment, an upper surface of each of the light blocking patterns LS may have a concave shape in the middle.

The light blocking patterns LS may absorb or block light emitted from each of the first to third sub pixels SPX1, SPX2, and SPX3. Accordingly, the light blocking patterns LS may prevent light emitted from the first to third sub pixels SPX1, SPX2, and SPX3 from proceeding in a specific direction. Accordingly, the light blocking patterns LS may control the viewing angle of the display device 10. For example, the light blocking patterns LS may include a material that absorbs or blocks light emitted from each of the first to third sub pixels SPX1, SPX2, and SPX3. Examples of the material that can be used for the light blocking patterns LS may include black dye, black pigment, carbon black, chromium, and the like. These may be used alone or in combination with each other.

Referring back to FIG. 3, the display transmission line TL-D may be electrically connected to the display pad electrode PE-D. In an embodiment, the display transmission line TL-D may be a fan-out line that transmits a data signal to a data line disposed in the display area DA. However, the disclosure is not limited thereto, and the display transmission line TL-D may include various lines such as a control transmission line that transmits a control signal to the gate driver and a power transmission line that transmits a power supply voltage to the light emitting device LED disposed in the display area DA.

The display transmission line TL-D may include a conductive material. In an embodiment, the display transmission line TL-D may be formed simultaneously with the gate electrode GE. However, the disclosure is not limited thereto, and the display transmission line TL-D may be formed simultaneously with at least one of various conductive layers forming the thin film transistor TR and the light emitting device LED disposed in the display area DA. The display transmission line TL-D may have a single-layer structure or a multi-layer structure including multiple conductive layers.

The display pad electrode PE-D may be disposed in the pad area PA on the substrate SUB. The display pad electrode PE-D may be electrically connected to the display transmission line TL-D. In an embodiment, the display pad electrode PE-D may be formed simultaneously with the source electrode SE and the drain electrode DE. However, the disclosure is not limited thereto, and the display pad electrode PE-D may be formed simultaneously with at least one of various conductive layers forming the thin film transistor TR and the light emitting device LED disposed in the display area DA. The display pad electrode PE-D may have a single-layer structure or a multi-layer structure including multiple conductive layers.

FIGS. 4 to 11 are schematic cross-sectional views illustrating an example of a method of manufacturing the display device of FIG. 1.

Figure 4:
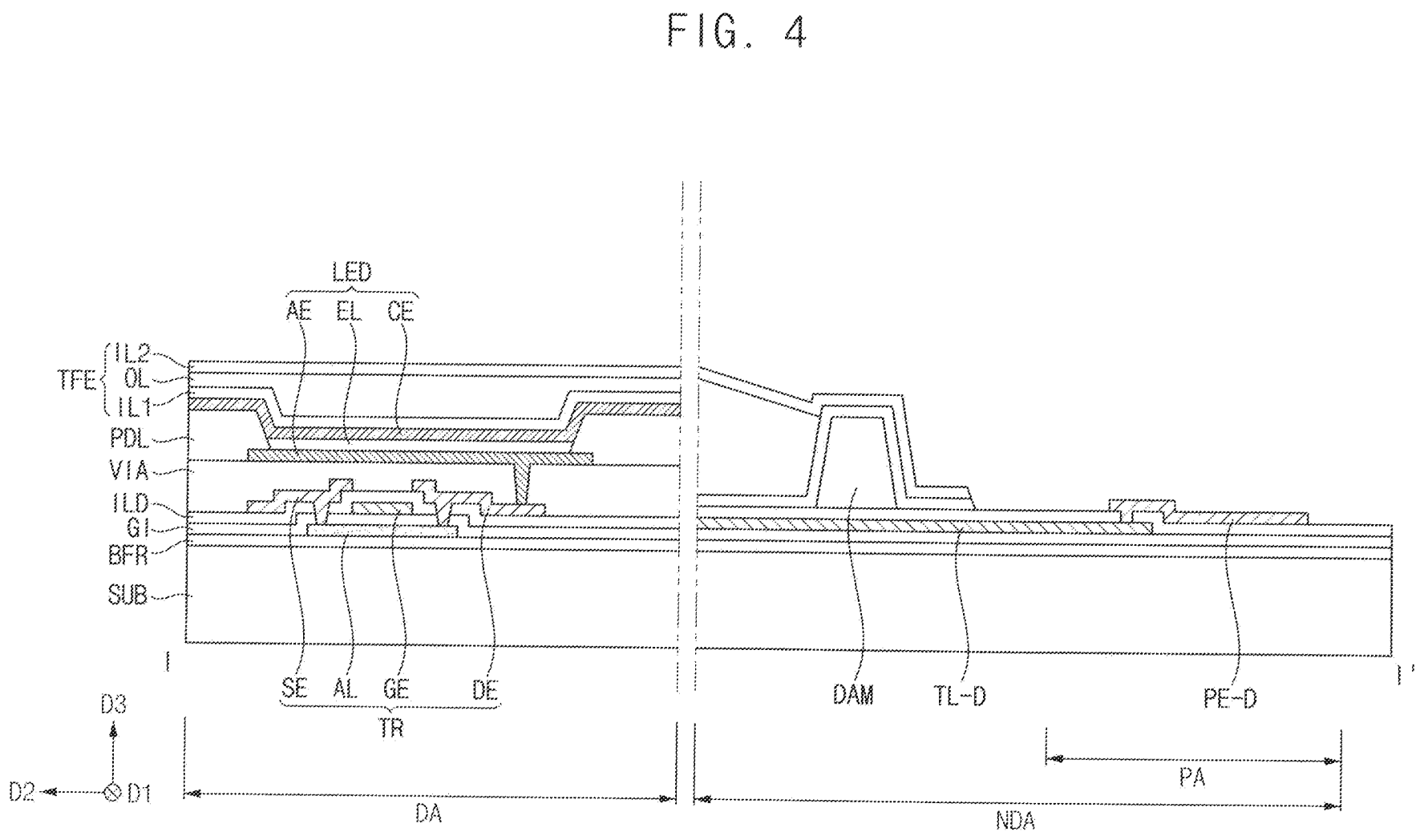

Referring to FIG. 4, the pixel including the thin film transistor TR and the light emitting device LED, the display transmission line TL-D, the display pad electrode PE-D, the dam part DAM, and the thin film encapsulation layer TFE may be formed on a substrate SUB.

The substrate SUB may include the display area DA and the non-display area NDA. The non-display area NDA may be positioned outside the display area DA. For example, the non-display area NDA may surround the display area DA in plan view. The non-display area NDA may include the pad area PA. The pad area PA may be positioned outside the display area DA.

The buffer layer BFR, the active layer AL, the gate insulating layer GI, the gate electrode GE, the interlayer insulating layer ILD, the source electrode SE, the drain electrode DE, the via insulating layer VIA, the anode electrode AE, the pixel defining layer PDL, the emission layer EL, the cathode electrode CE, and the thin film encapsulation layer TFE may be sequentially formed in the display area DA on the substrate SUB. In an embodiment, each of the gate insulating layer GI, the interlayer insulating layer ILD, and the via insulating layer VIA may be entirely formed in the display area DA and the non-display area NDA.

The display transmission line TL-D, the display pad electrode PE-D, and the dam part DAM may be formed in the non-display area NDA on the substrate SUB. Specifically, the display pad electrode PE-D may be positioned in the pad area PA. In an embodiment, the display transmission line TL-D may be formed simultaneously with the gate electrode GE. The display pad electrode PE-D may be formed simultaneously with the source electrode SE and the drain electrode DE. However, the disclosure is not necessarily limited thereto.

Referring to FIG. 5, the protective film PF may be formed in the display area DA and the pad area PA on the substrate SUB. For example, the protective film PF may be entirely formed in the display area DA and the non-display area NDA. Accordingly, the protective film PF may cover the thin film encapsulation layer TFE and the display pad electrode PE-D. In an embodiment, the protective film PF may be formed using an inorganic material such as silicon oxide (SiO), silicon nitride (SiN), and/or silicon oxynitride (SiON). Specifically, the protective film PF may be formed using silicon nitride (SiN).

Figure 6:
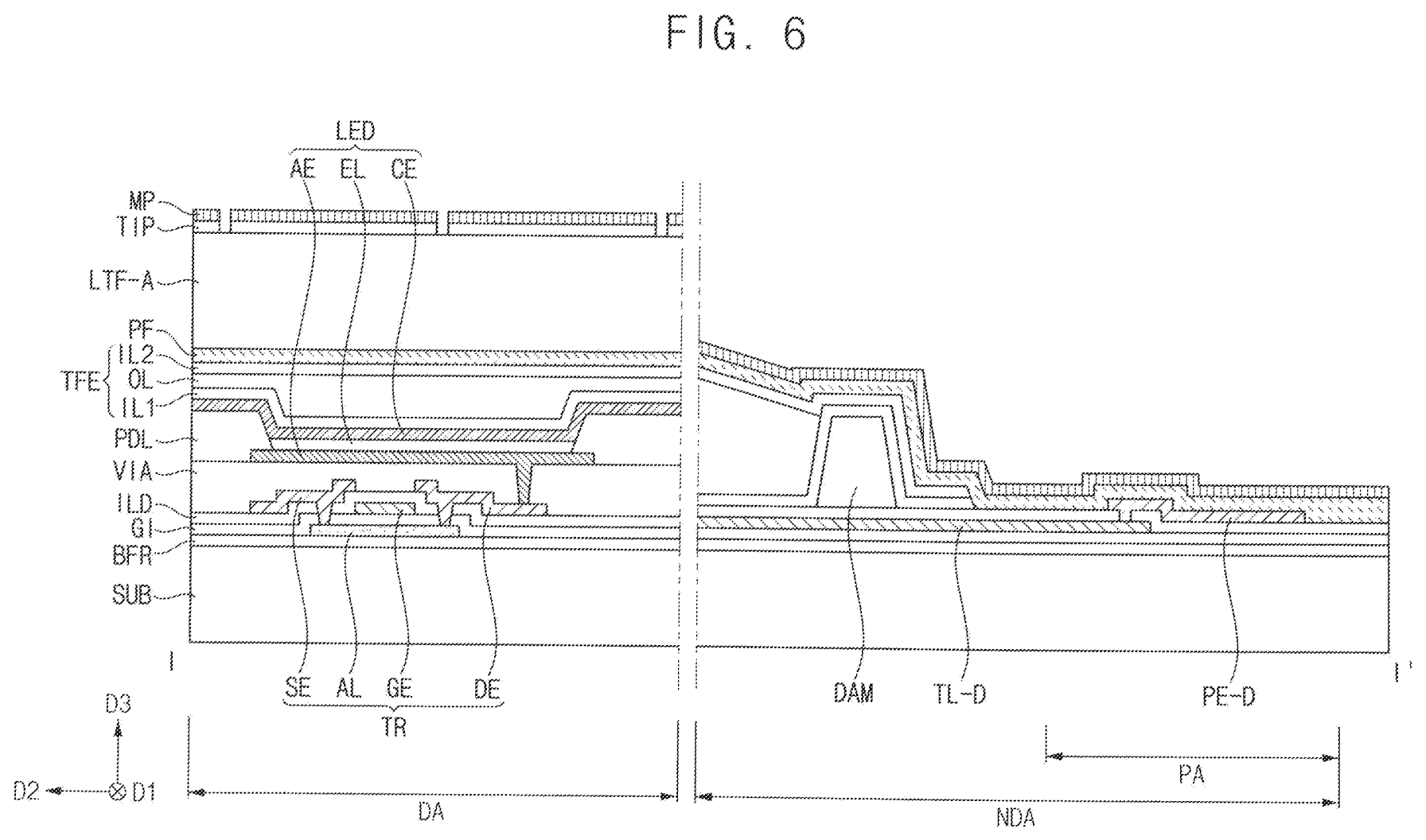

Referring to FIG. 6, the preliminary light transmitting film LTF-A may be formed in the display area DA on the substrate SUB. In an embodiment, the preliminary light transmitting film LTF-A may be formed using an organic insulating material such as a photoresist, polyacrylic resin, polyimide-based resin, polyamide-based resin, a siloxane-based resin, an acryl-based resin, an epoxy-based resin, and/or the like.

Subsequently, the transparent inorganic film pattern TIP may be formed on the preliminary light transmitting film LTF-A. The transparent inorganic film pattern TIP may function as a mask in an etching process of the preliminary light transmitting film LTF-A which will be described later. In an embodiment, the transparent inorganic film pattern TIP may be formed using a transparent oxide such as indium tin oxide (ITO) or indium zinc oxide (IZO).

Subsequently, the metal pattern MP may be formed on the transparent inorganic film pattern TIP. For example, the metal pattern MP may be formed to correspond to the transparent inorganic film pattern TIP in the display area DA. Accordingly, the metal pattern MP may cover an upper surface of the transparent inorganic film pattern TIP and may function as a mask in the etching process of the preliminary light transmitting film LTF-A which will be described later. In an embodiment, the metal pattern MP may be formed using a metal material such as aluminum (Al), molybdenum (Mo), an alloy containing aluminum, or an alloy containing molybdenum.

In an embodiment, as shown in FIG. 6, the metal pattern MP may be formed to extend to the non-display area NDA.

For example, the metal pattern MP may be formed to extend to the pad area PA. In other words, the metal pattern MP may be entirely formed in the non-display area NDA. Accordingly, the metal pattern MP may cover an upper surface of the protective film PF in the non-display area NDA. Accordingly, during the etching process of the preliminary light transmitting film LTF-A which will be described later, the protective film PF may be less affected by the etching process due to the metal pattern MP. However, the disclosure is not necessarily limited thereto, and in another embodiment, the metal pattern MP may be formed to correspond to the transparent inorganic film pattern TIP in the display area DA, and not be formed in the non-display area NDA.

Figure 7:
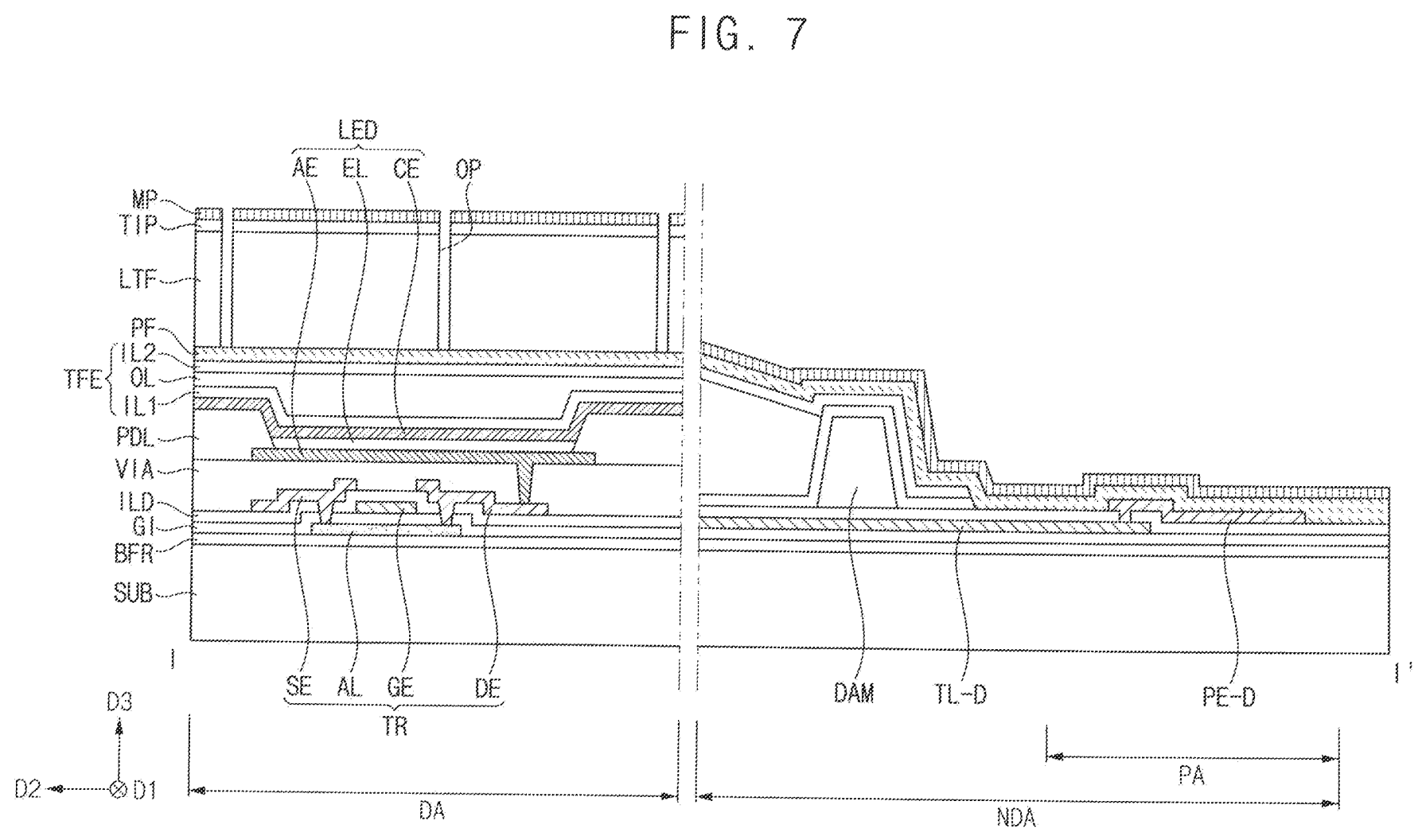

Referring to FIG. 7, the openings OP may be formed by etching the preliminary light transmitting film LTF-A using the transparent inorganic film pattern TIP and the metal pattern MP as a mask. In other words, the preliminary light transmitting film LTF-A may be patterned according to the pattern of the transparent inorganic film pattern TIP and the metal pattern MP. Accordingly, the light transmitting film LTF defining the openings OP may be formed. In an embodiment, the openings OP may be formed by dry etching, but the disclosure is not limited thereto. The openings OP may expose a portion of the protective film PF.

In an embodiment, in the process of etching the preliminary light transmitting film LTF-A, the preliminary light transmitting film LTF-A may have a first etch rate and the protective film PF may have a second etch rate lower than the first etch rate. In other words, in case the process of etching the preliminary light transmitting film LTF-A is performed, the protective film PF may not be affected by the etching process. Accordingly, in case the process of etching the preliminary light transmitting film LTF-A is performed, since the display pad electrode PE-D is covered by the protective film PF, damage due to the etching process may be prevented.

Figure 8:
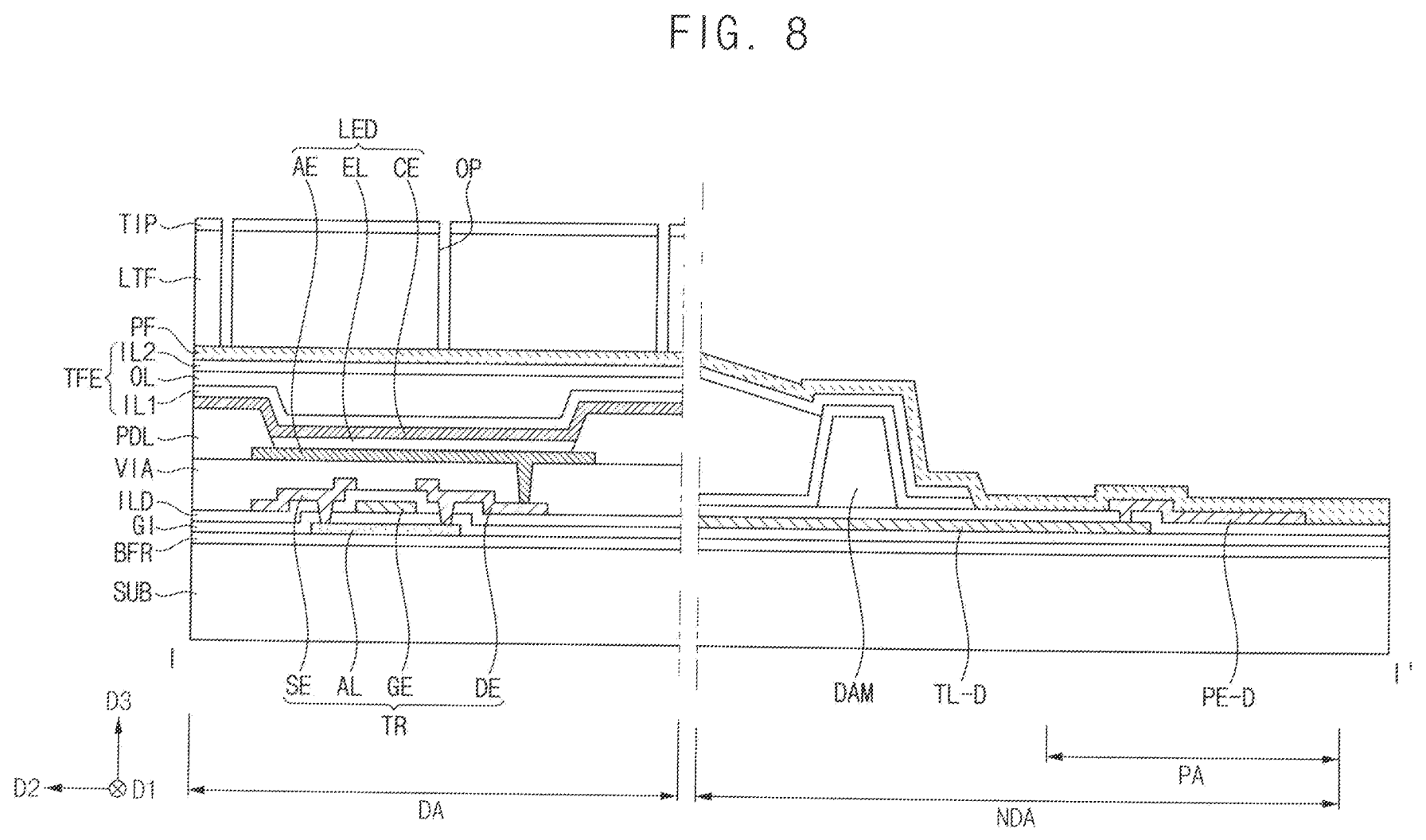

Referring to FIG. 8, after the light transmitting film LTF defining the openings OP is formed, the metal pattern MP may be removed. In an embodiment, the metal pattern MP may be removed using wet etching, but the disclosure is not limited thereto.

Figure 9:
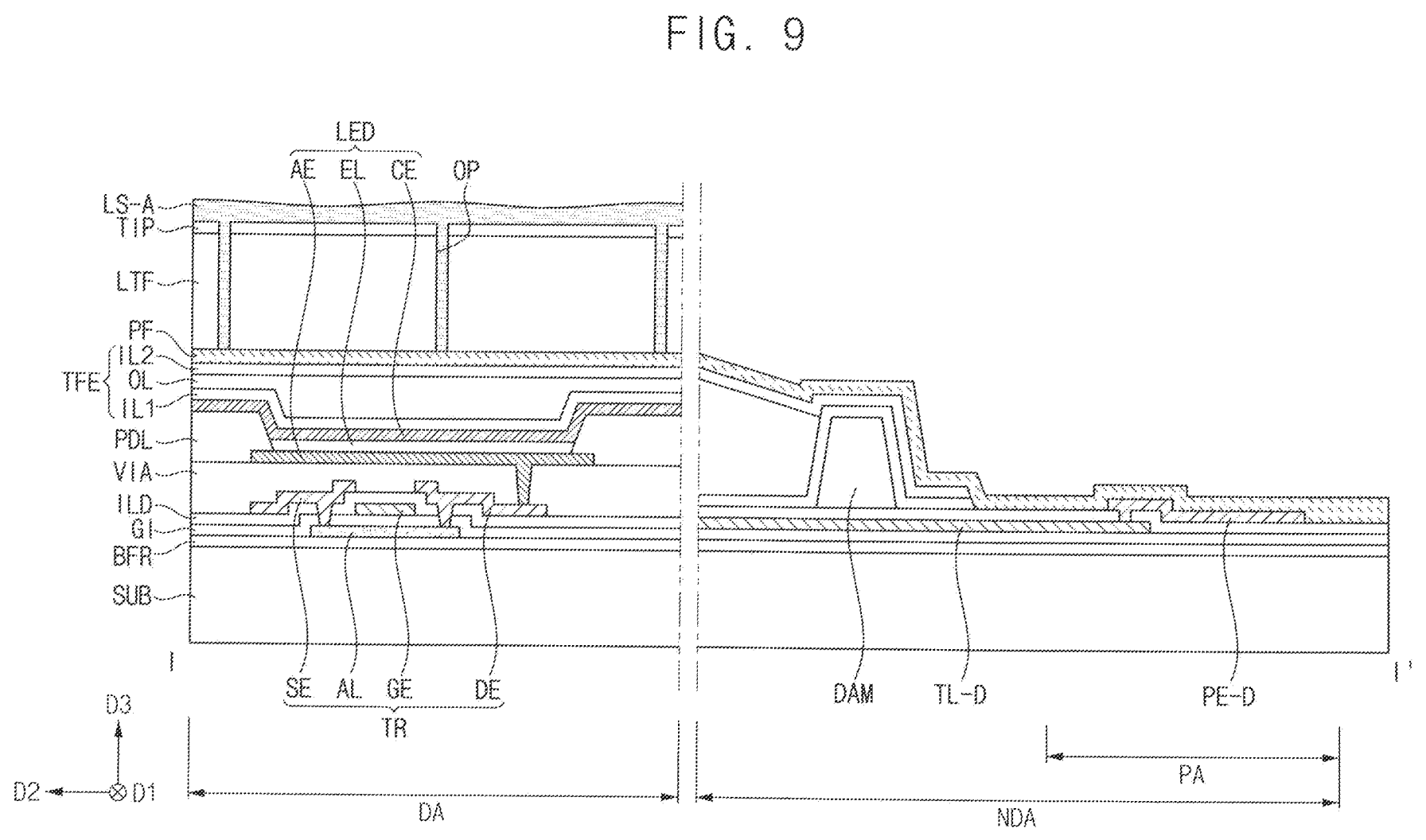

Referring to FIG. 9, a preliminary light blocking pattern LS-A filling the openings OP may be formed in the display area DA on the substrate SUB. The preliminary light blocking pattern LS-A may be formed to be higher than the transparent inorganic film pattern TIP. In other words, the preliminary light blocking pattern LS-A may be formed to cover the light transmitting film LTF and the transparent inorganic film pattern TIP while filling the openings OP.

Figure 10:
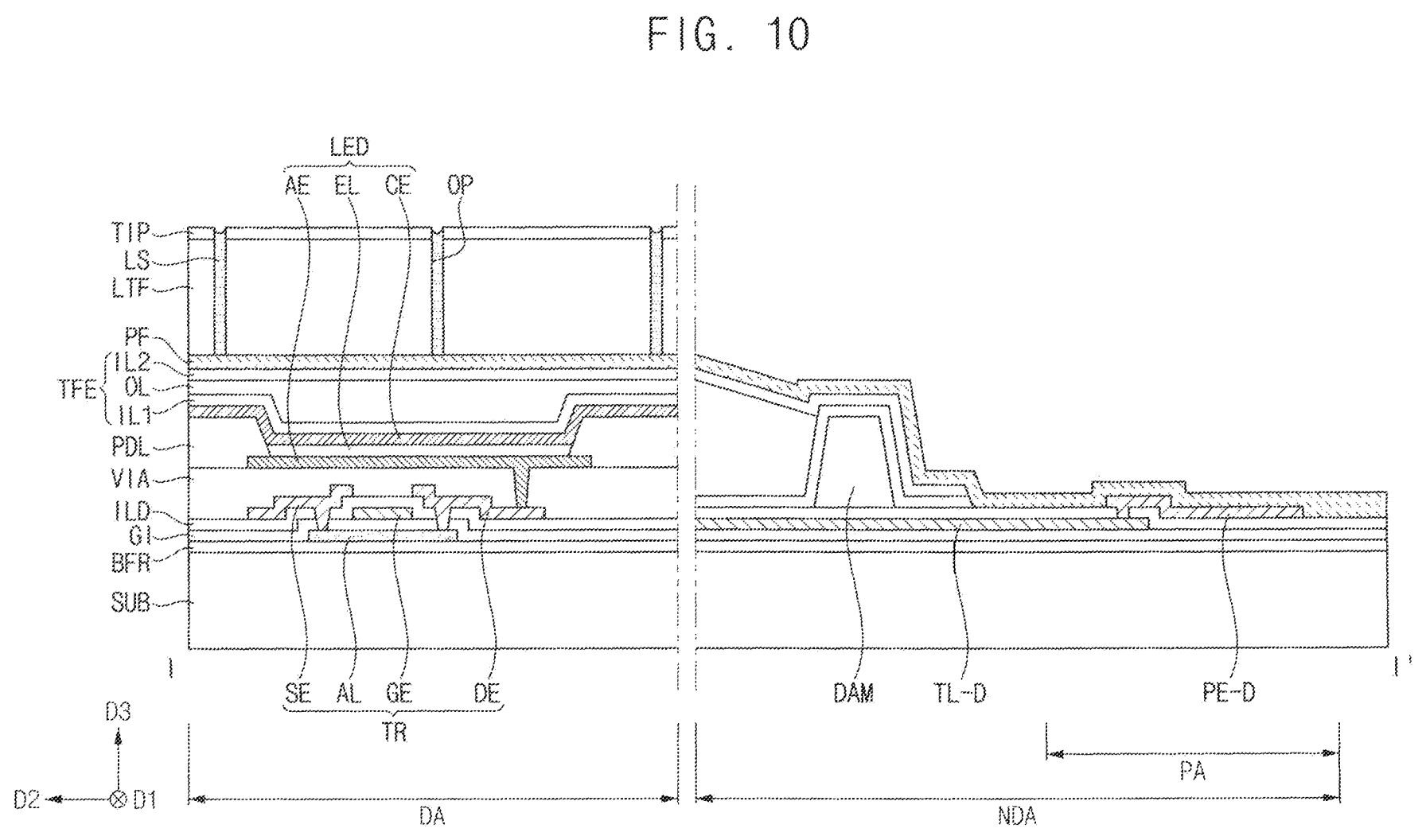

Referring to FIG. 10, a portion of the preliminary light blocking pattern LS-A formed higher than the transparent inorganic film pattern TIP may be removed to form multiple light blocking patterns LS. In other words, the upper end of each of the light blocking patterns LS may be planarized based on the upper end of the transparent inorganic film pattern TIP through a polishing process. Examples of the polishing process may include a chemical mechanical polishing process, but the disclosure is not limited thereto. Accordingly, each of the light blocking patterns LS may be disposed in the openings OP. In an embodiment, the upper end of each of the light blocking patterns LS may be disposed on the same plane as the upper end of the transparent inorganic film pattern TIP. In an embodiment, the upper surface of each of the light blocking patterns LS may have a concave shape in the middle.

The light blocking patterns LS may absorb or block light emitted from the light emitting device LED. Accordingly, the light blocking patterns LS may prevent the light emitted from the light emitting device LED from proceeding in a specific direction. Accordingly, the light blocking patterns LS may control the viewing angle of the display device 10. For example, the light blocking patterns LS may be formed using a material that absorbs or blocks light emitted from the light emitting device LED. Examples of the material that can be used for the light blocking patterns LS may include black dye, black pigment, carbon black, chromium, and the like.

Figure 11:
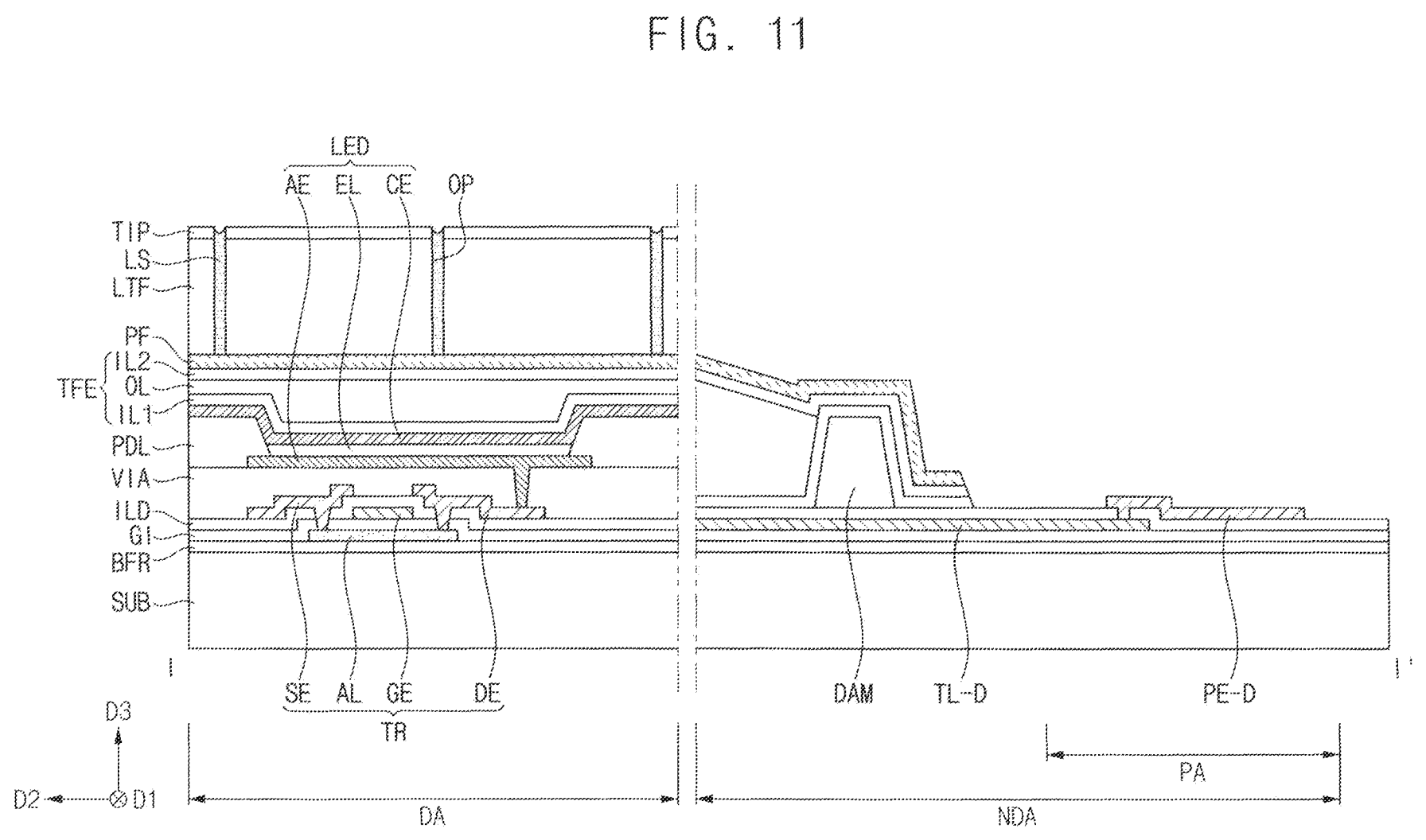

Referring to FIG. 11, in an embodiment, after the light blocking patterns LS are formed, the protective film PF of the pad area PA may be selectively removed to expose the display pad electrode PE-D. In an embodiment, the protective film PF of the pad area PA may be selectively removed by a whole surface etching process. However, the disclosure is not necessarily limited thereto, and in another embodiment, after the preliminary light blocking patterns LS-A are formed, before removing the portion formed higher than the transparent inorganic film pattern TIP among the preliminary light blocking pattern LS-A, the protective film PF of the pad area PA may be selectively removed.

As shown in FIG. 11, the protective film PF may extend from the display area DA to an area between the display area DA and the pad area PA (e.g., a portion of the non-display area NDA adjacent to the display area DA). Also, the protective film PF may be spaced apart from the pad area PA. For example, the end of the protective film PF adjacent to the pad area PA may be positioned at the boundary of the pad area PA. However, the disclosure is not limited thereto, and if the display pad electrode PE-D can be exposed, the position of the end of the protective film PF in the non-display area NDA may vary.

According to embodiments, the light blocking patterns LS for controlling the viewing angle may be internalized in the display panel DP. Accordingly, power consumption of the display panel DP may be reduced, a thickness of the display panel DP may be reduced, and a manufacturing cost of the display panel DP may be reduced.

Also, in case that the light transmitting film LTF is formed using an etching process to internalize the light blocking patterns LS in the display panel DP, the pad electrodes may be covered by the protective film PF. Accordingly, damage to the pad electrodes due to the etching process may be prevented. Accordingly, the reliability of the display device may be improved.

Figure 12:
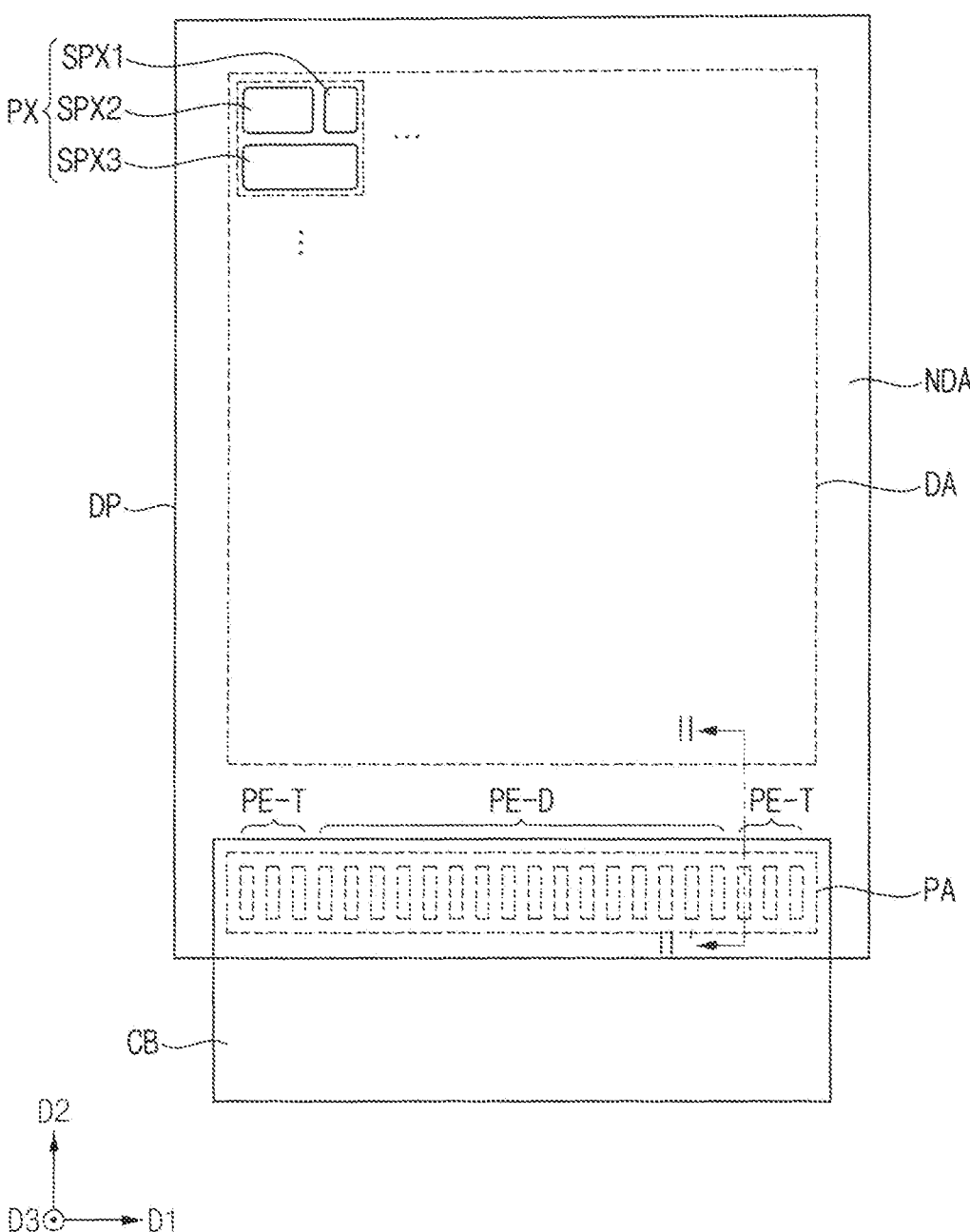
FIG. 12 is a schematic plan view illustrating a display device according to another embodiment.

FIG. 12 is a schematic plan view illustrating a display device according to another embodiment, and FIG. 13 is a schematic cross-sectional view taken along line II-Ir of FIG. 12.

Referring to FIGS. 12 and 13, the display device 20 according to another embodiment may be substantially the same as the display device 10 described above with reference to FIGS. 1 to 3, except for a sensing layer SL, a second dam part DAM2, a touch transmission line TL-T, and a touch pad electrode PE-T.

In an embodiment, the display panel DP may include the sensing layer SL disposed in the display area DA on the substrate SUB. The sensing layer SL may be disposed on the thin film encapsulation layer TFE. In an embodiment, the sensing layer SL may include a first touch electrode TE1, a first touch insulating layer TI1, a second touch electrode TE2, and a second touch insulating layer TI2.

The first touch electrode TE1 may be disposed on the thin film encapsulation layer TFE. In an embodiment, the first touch electrode TE1 may be disposed to overlap the pixel defining layer PDL in plan view. The first touch electrode TE1 may be formed of a metal, an alloy, a conductive metal oxide, a transparent conductive material, or the like.

The first touch insulating layer TI1 may be disposed on the thin film encapsulation layer TFE on which the first touch electrode TE1 is disposed. The first touch insulating layer TI1 may cover the first touch electrode TE1. The first touch insulating layer TI1 may include an inorganic insulating material. Examples of the inorganic insulating material that can be used as the first touch insulating layer TI1 may include silicon oxide, silicon nitride, silicon oxynitride, and the like. These may be used alone or in combination with each other.

The second touch electrode TE2 may be disposed on the first touch insulating layer TI1 and overlap the first touch electrode TE1. The second touch electrode TE2 may be electrically connected to the first touch electrode TE1 through a contact hole formed in the first touch insulating layer TI1. The second touch electrode TE2 may include a metal, an alloy, a conductive metal oxide, a transparent conductive material, or the like.

The first touch electrode TE1 and the second touch electrode TE2 may constitute a touch electrode. In an embodiment, the touch electrode may have a mesh structure in plan view. However, the disclosure is not necessarily limited thereto, and the touch electrode may have various shapes.

The second touch insulating layer TI2 may be disposed on the first touch insulating layer TI1 on which the second touch electrode TE2 is disposed. The second touch insulating layer TI2 may cover the second touch electrode TE2. The second touch insulating layer TI2 may include an organic insulating material. Examples of the organic insulating material that can be used as the second touch insulating layer TI2 may include photoresist, polyacryl-based resin, polyimide-based resin, and polyamide-based resin, siloxane-based resin, acryl-based resin, epoxy-based resin, and the like. These may be used alone or in combination with each other. In an embodiment, the second touch insulating layer TI2 may be formed by an inkjet method for discharging ink or a solution including an organic insulating material. The second touch insulating layer TI2 may have a substantially flat top surface.

In an embodiment, the display panel DP may include a first dam part DAM1 and a second dam part DAM2 disposed in the non-display area NDA on the substrate SUB. The first dam part DAM1 may be substantially the same as the dam part DAM described with reference to FIG. 3.

The second dam part DAM2 may be disposed in the non-display area NDA between the display area DA and the pad area PA. In case that the second touch insulating layer TI2 is formed by an inkjet method for discharging ink or a solution including an organic insulating material, the second dam part DAM2 may prevent the organic insulating material from overflowing in the edge direction of the substrate SUB (e.g., the right direction in FIG. 13). Although the second dam part DAM2 overlaps the first dam part DAM1 in the third direction D3 in FIG. 2, a position of the second dam part DAM2 is not necessarily limited thereto. Also, although only one second dam part DAM2 which is a single layer is illustrated in FIG. 13, the disclosure is not limited thereto. For example, the second dam part DAM2 may have a multilayer structure. The display panel DP may include multiple second dam parts DAM2. Also, in another embodiment, the second dam part DAM2 may be omitted. The second touch insulating layer TI2 may be entirely formed in the display area DA and the non-display area NDA. For example, the second touch insulating layer TI2 may be formed to extend to the pad area PA. Accordingly, the second touch insulating layer TI2 may cover the touch pad electrode PE-T.

In an embodiment, as the sensing layer SL is disposed on the thin film encapsulation layer TFE, the protective film PF may be disposed on the sensing layer SL. For example, the protective film PF may be disposed on the second touch insulating layer TI2. In an embodiment, the protective film PF may extend from the display area DA to an area between the display area DA and the pad area PA (e.g., a portion of the non-display area NDA adjacent to the display area DA). In an embodiment, the protective film PF may cover the second dam part DAM2. Also, the protective film PF may be spaced apart from the pad area PA. In other words, an end of the protective film PF adjacent to the pad area PA may be positioned between the second dam part DAM2 and the pad area PA. However, the disclosure is not necessarily limited thereto, and if the touch pad electrode PE-T can be exposed, the position of the end of the protective film PF in the non-display area NDA may vary.

In an embodiment, the protective film PF may include an inorganic material. Examples of the inorganic material that can be used for the protective film PF may include silicon oxide (SiO), silicon nitride (SiN), silicon oxynitride (SiON), and the like. These may be used alone or in combination with each other. Specifically, the protective film PF may include silicon nitride (SiN). The protective film PF may have a single-layer structure or a multi-layer structure including multiple insulating layers.

The touch transmission line TL-T may be electrically connected to the touch pad electrode PE-T. In an embodiment, the touch transmission line TL-T may be a fan-out line that transmits a touch signal to a touch signal line disposed in the display area DA. However, the disclosure is not limited thereto, and the touch transmission line TL-T may be formed simultaneously with at least one of various conductive layers forming the thin film transistor TR, the light emitting device LED, the first touch electrode TE1, and the second touch electrode TE2. The touch transmission line TL-T may have a single-layer structure or a multi-layer structure including multiple conductive layers.

The touch pad electrode PE-T may be disposed in the pad area PA on the substrate SUB. For example, the touch pad electrode PE-T may be disposed in the pad area PA on the substrate SUB together with the display pad electrode PE-D. The touch pad electrode PE-T may be electrically connected to the touch transmission line TL-T. In an embodiment, the touch pad electrode PE-T may be formed simultaneously with at least one of various conductive layers forming the thin film transistor TR, the light emitting device LED, the first touch electrode TE1, and the second touch electrode TE2. The touch pad electrode PE-T may have a single-layer structure or a multi-layer structure including multiple conductive layers.

FIGS. 14 to 21 are schematic cross-sectional views illustrating an example of a method of manufacturing the display device of FIG. 12.

Referring to FIG. 14, the pixel including the thin film transistor TR and the light emitting device LED, the touch transmission line TL-T, the touch pad electrode PE-T, the first dam part DAM1, the thin film encapsulation layer TFE, the second dam part DAM2, and the sensing layer SL may be formed on a substrate SUB.

The substrate SUB may include the display area DA and the non-display area NDA. The non-display area NDA may be positioned outside the display area DA. For example, the non-display area NDA may surround the display area DA in plan view. The non-display area NDA may include the pad area PA. The pad area PA may be positioned outside the display area DA.

The buffer layer BFR, the active layer AL, the gate insulating layer GI, the gate electrode GE, the interlayer insulating layer ILD, the source electrode SE, the drain electrode DE, the via insulating layer VIA, the anode electrode AE, the pixel defining layer PDL, the emission layer EL, the cathode electrode CE, the thin film encapsulation layer TFE, and the sensing layer SL may be sequentially formed in the display area DA on the substrate SUB. In an embodiment, each of the gate insulating layer GI, the interlayer insulating layer ILD, and the via insulating layer VIA may be entirely formed in the display area DA and the non-display area NDA.

The touch transmission line TL-T, the touch pad electrode PE-T, and the first dam part DAM1, and the second dam part DAM2 may be formed in the non-display area NDA on the substrate SUB. Specifically, the touch pad electrode PE-T may be positioned in the pad area PA.

Figure 15:
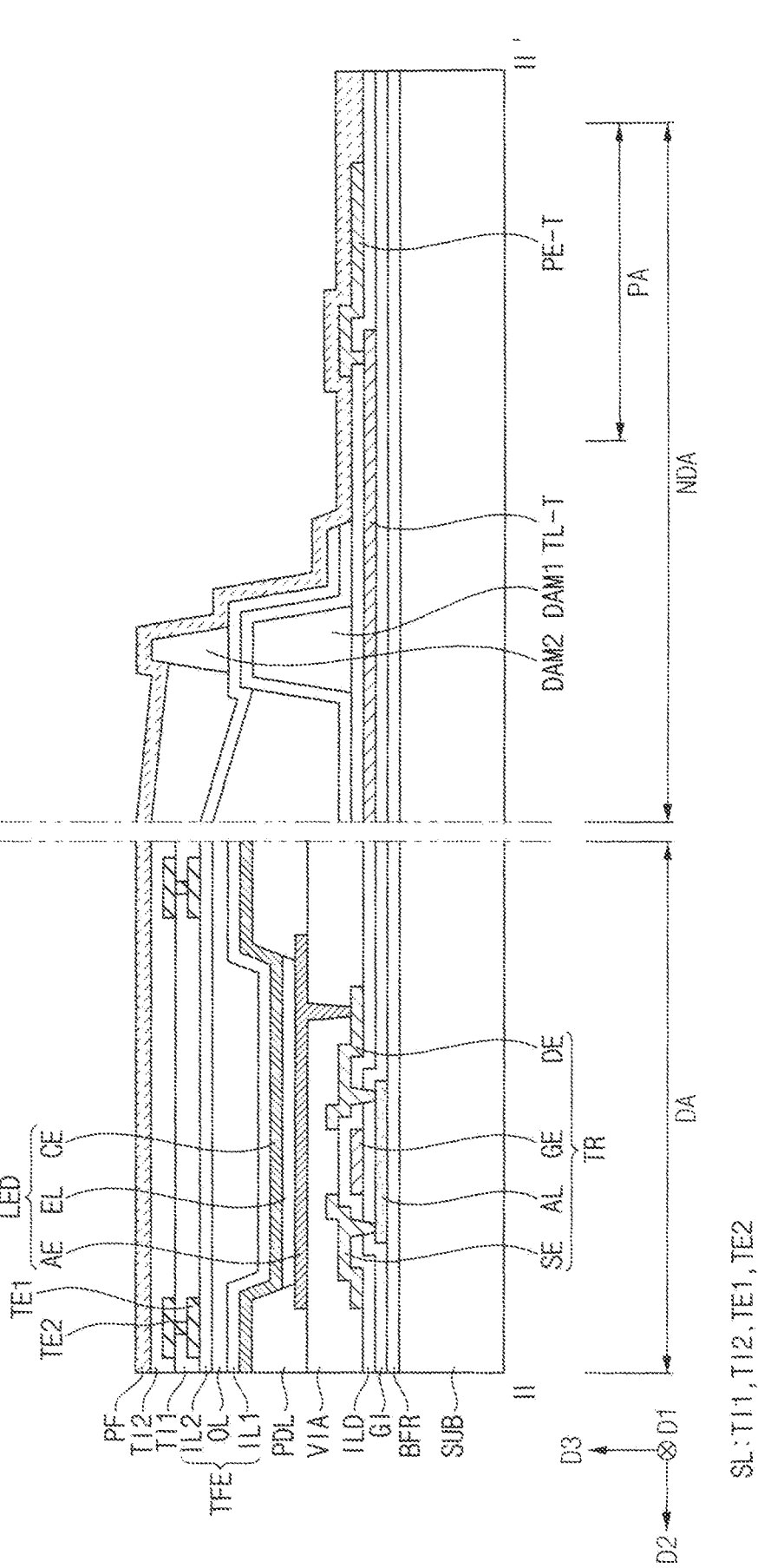

Referring to FIG. 15, the protective film PF may be formed in the display area DA and the pad area PA on the substrate SUB. For example, the protective film PF may be entirely formed in the display area DA and the non-display area NDA. Accordingly, the protective film PF may cover the sensing layer SL and the touch pad electrode PE-T. In an embodiment, the protective film PF may be formed using an inorganic material such as silicon oxide (SiO), silicon nitride (SiN), and/or silicon oxynitride (SiON). Specifically, the protective film PF may be formed using silicon nitride (SiN).

Figure 16:
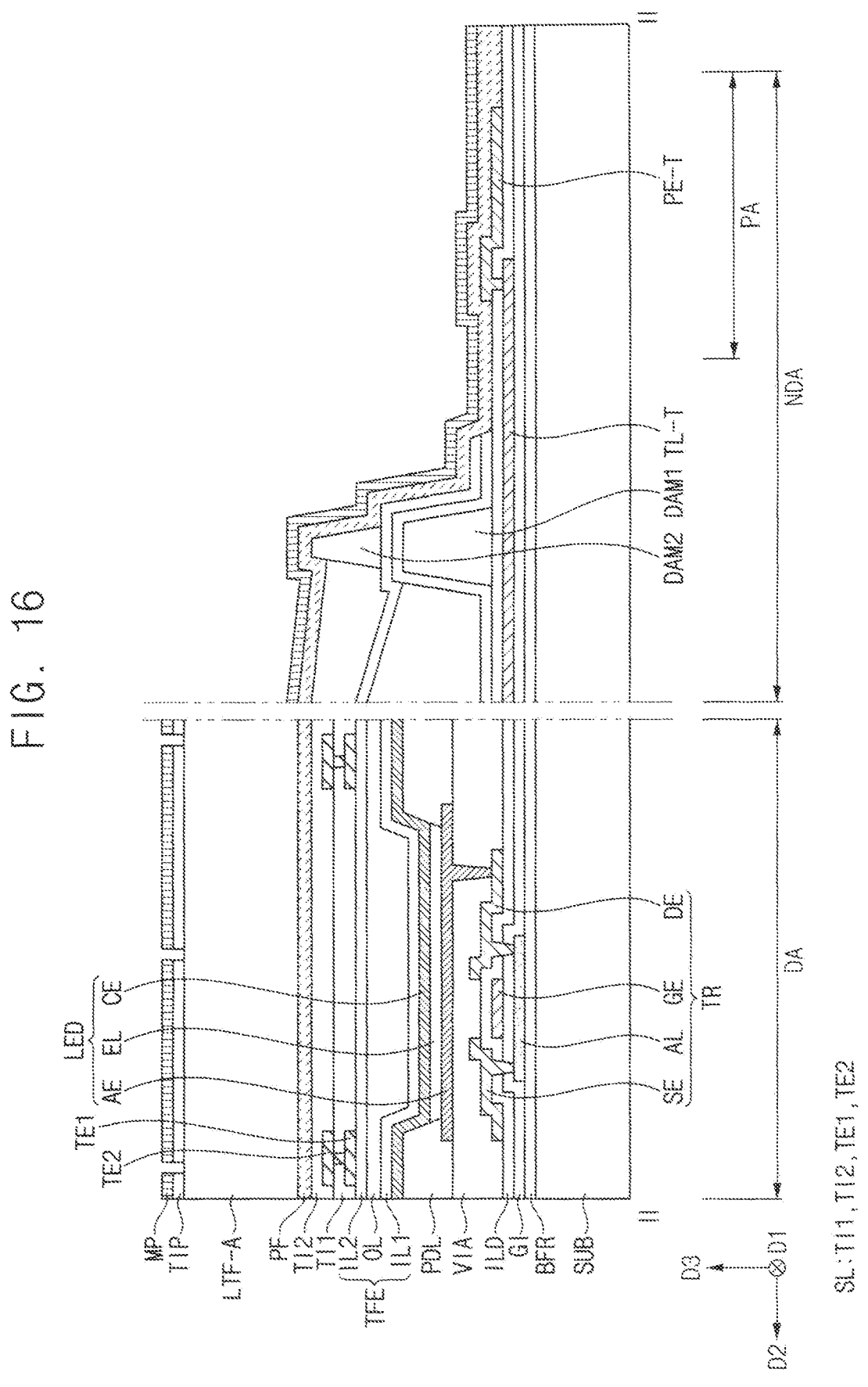

Referring to FIG. 16, the preliminary light transmitting film LTF-A may be formed in the display area DA on the protective film PF. In an embodiment, the preliminary light transmitting film LTF-A may be formed using an organic insulating material such as a photoresist, polyacrylic resin, polyimide-based resin, polyamide-based resin, a siloxane-based resin, an acryl-based resin, an epoxy-based resin, and/or the like.

Subsequently, the transparent inorganic film pattern TIP may be formed on the preliminary light transmitting film LTF-A. The transparent inorganic film pattern TIP may function as a mask in an etching process of the preliminary light transmitting film LTF-A which will be described later. In an embodiment, the transparent inorganic film pattern TIP may be formed using a transparent oxide such as indium tin oxide (ITO) or indium zinc oxide (IZO).

Subsequently, the metal pattern MP may be formed on the transparent inorganic film pattern TIP. For example, the metal pattern MP may be formed to correspond to the transparent inorganic film pattern TIP in the display area DA. Accordingly, the metal pattern MP may cover an upper surface of the transparent inorganic film pattern TIP and may function as a mask in the etching process of the preliminary light transmitting film LTF-A which will be described later.

In an embodiment, as shown in FIG. 16, the metal pattern MP may be formed to extend to the non-display area NDA. For example, the metal pattern MP may be formed to extend to the pad area PA. Accordingly, the metal pattern MP may cover an upper surface of the protective film PF in the non-display area NDA. Accordingly, during the etching process of the preliminary light transmitting film LTF-A which will be described later, the protective film PF may be less affected by the etching process by the metal pattern MP. However, the disclosure is not necessarily limited thereto, and in another embodiment, the metal pattern may be formed to correspond to the transparent inorganic film pattern TIP in the display area DA, and not be formed in the non-display area NDA.

Figure 17:
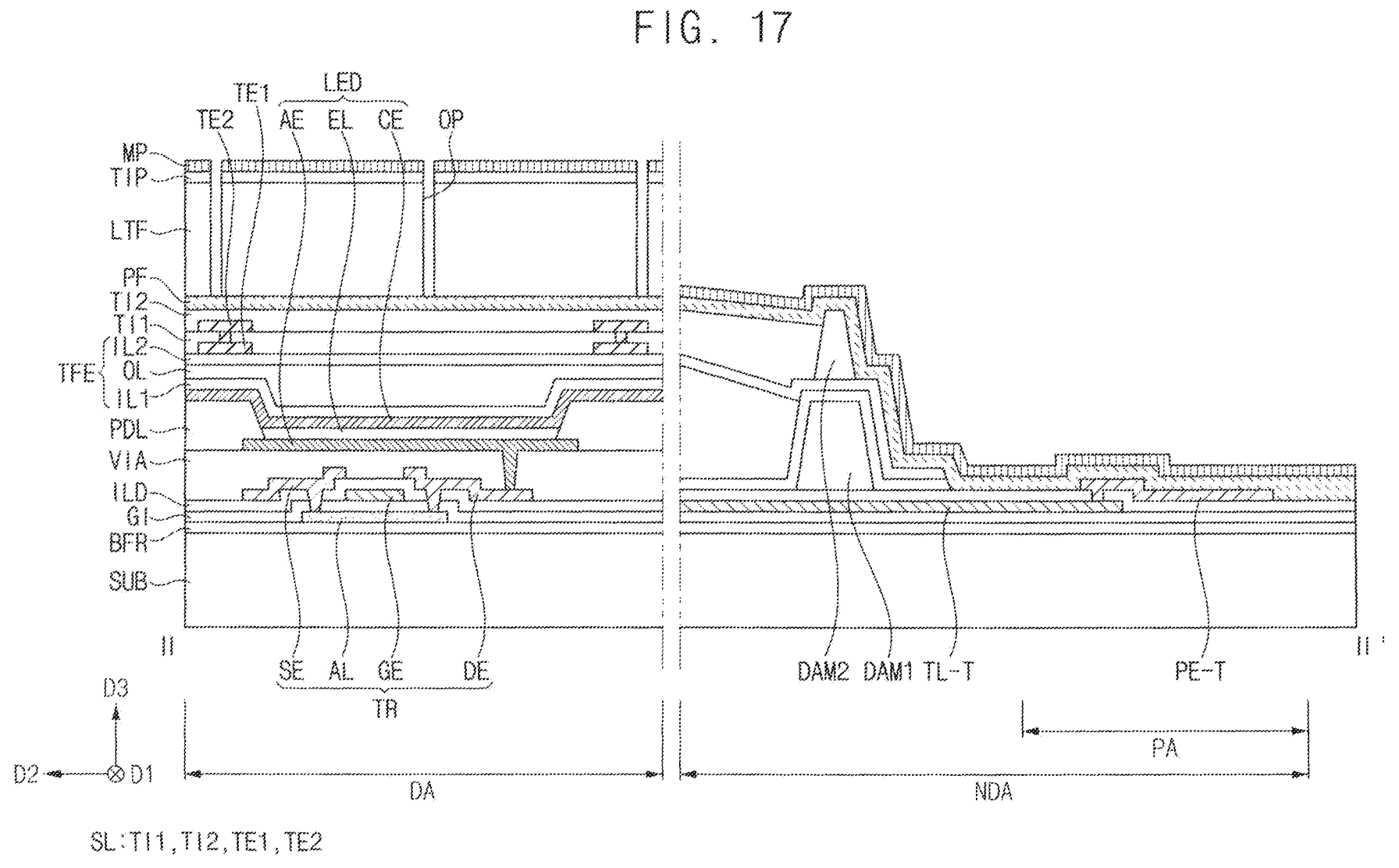

Referring to FIG. 17, the openings OP may be formed by etching the preliminary light transmitting film LTF-A using the transparent inorganic film pattern TIP and the metal pattern MP as a mask. Accordingly, the light transmitting film LTF defining the openings OP may be formed. In an embodiment, the openings OP may be formed by dry etching, but the disclosure is not limited thereto. The openings OP may expose a portion of the protective film PF.

In an embodiment, in the process of etching the preliminary light transmitting film LTF-A, the preliminary light transmitting film LTF-A may have a first etch rate and the protective film PF may have a second etch rate lower than the first etch rate. In other words, in case that the process of etching the preliminary light transmitting film LTF-A is performed, the protective film PF may not be affected by the etching process. Accordingly, in case the process of etching the preliminary light transmitting film LTF-A is performed, since the touch pad electrode PE-T is covered by the protective film PF, damage due to the etching process may be prevented.

Referring to FIG. 18, after the light transmitting film LTF defining the openings OP is formed, the metal pattern MP may be removed. In an embodiment, the metal pattern MP may be removed using wet etching, but the disclosure is not limited thereto.

Figure 19:
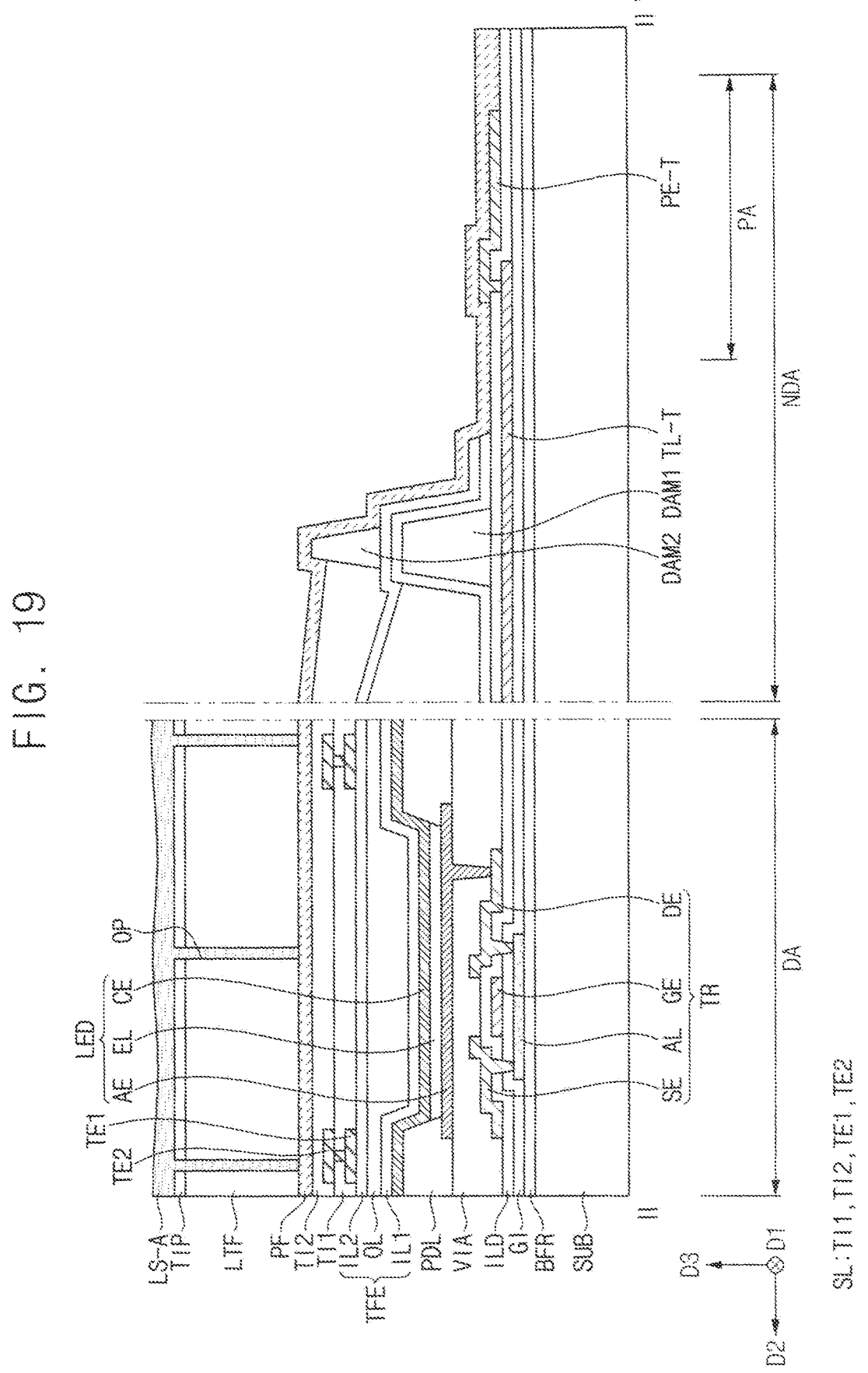
Figure 20:
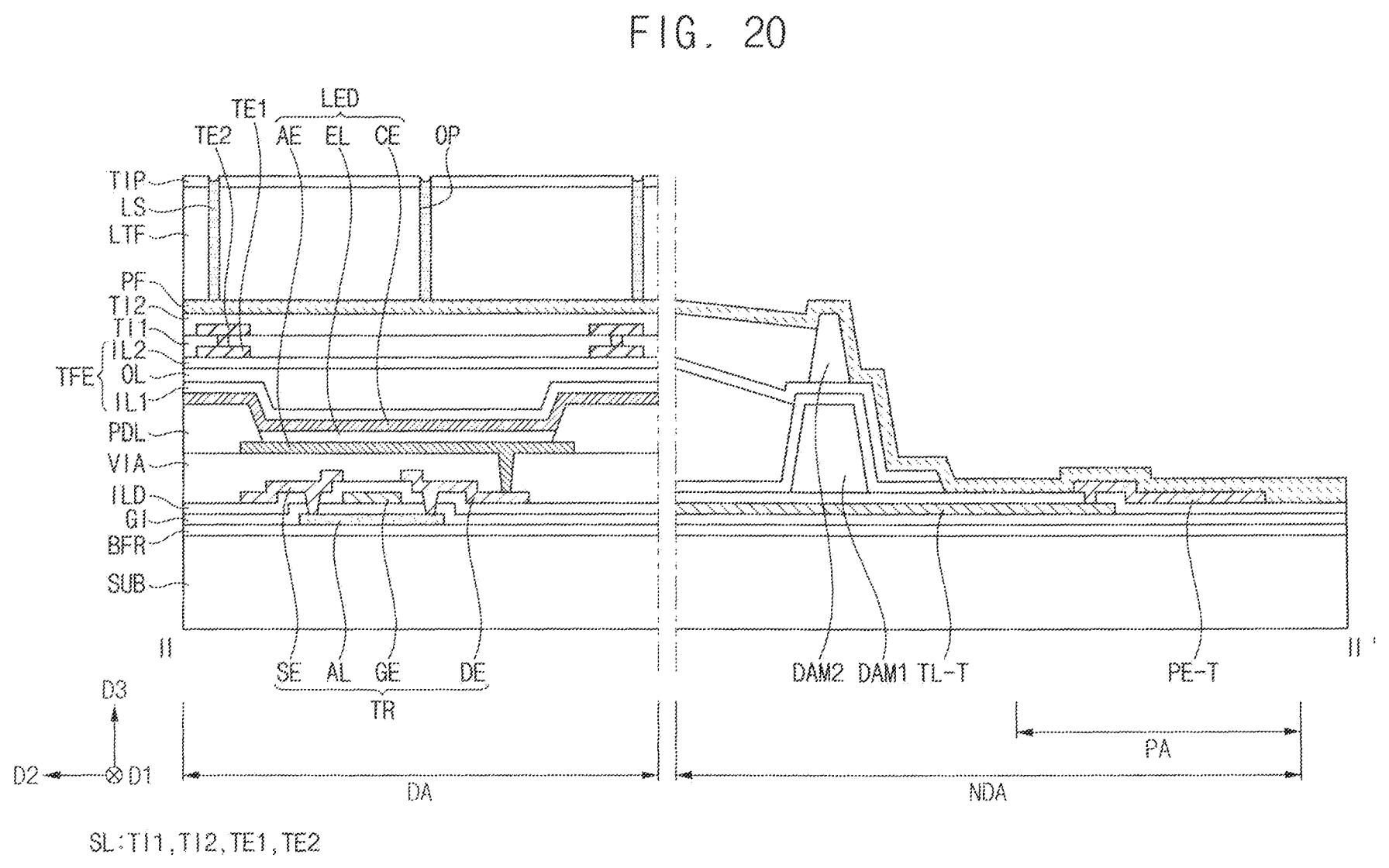

Referring to FIGS. 19 and 20, a preliminary light blocking pattern LS-A filling the openings OP may be formed in the display area DA on the substrate SUB. The preliminary light blocking pattern LS-A may be formed to cover the light transmitting film LTF and the transparent inorganic film pattern TIP while filling the openings OP. Subsequently, a portion of the preliminary light blocking pattern LS-A formed higher than the transparent inorganic film pattern TIP may be removed to form light blocking patterns LS. In other words, the upper end of each of the light blocking patterns LS may be planarized based on the upper end of the transparent inorganic film pattern TIP through a polishing process. Accordingly, each of the light blocking patterns LS may be disposed in the openings OP. In an embodiment, the upper end of each of the light blocking patterns LS may be disposed on the same plane as the upper end of the transparent inorganic film pattern TIP. In an embodiment, the upper surface of each of the light blocking patterns LS may have a concave shape in the middle.

Figure 21:
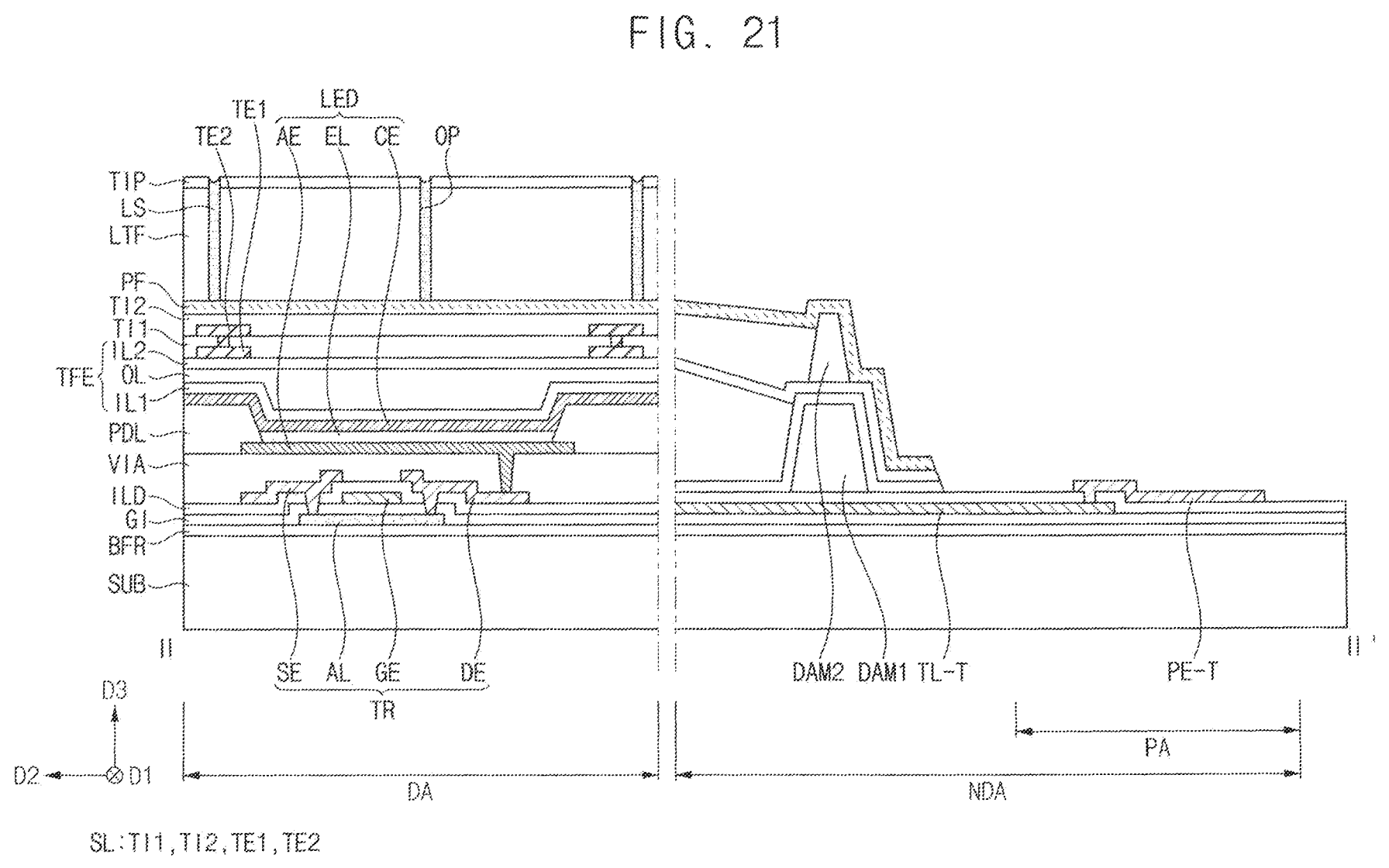

Referring to FIG. 21, in an embodiment, after the light blocking patterns LS are formed, the protective film PF of the pad area PA may be selectively removed to expose the touch pad electrode PE-T. In an embodiment, the protective film PF of the pad area PA may be selectively removed by a whole surface etching process. However, the disclosure is not necessarily limited thereto, and in another embodiment, after the preliminary light blocking patterns LS-A are formed, before removing the portion formed higher than the transparent inorganic film pattern TIP among the preliminary light blocking pattern LS-A, the protective film PF of the pad area PA may be selectively removed.

As shown in FIG. 21, the protective film PF may extend from the display area DA to an area between the display area DA and the pad area PA (e.g., a portion of the non-display area NDA adjacent to the display area DA). Also, the protective film PF may be spaced apart from the pad area PA. For example, the end of the protective film PF adjacent to the pad area PA may be positioned at the boundary of the pad area PA. However, the disclosure is not limited thereto, and if the touch pad electrode PE-T can be exposed, the position of the end of the protective film PF in the non-display area NDA may vary.

According to embodiments, the light blocking patterns LS for controlling the viewing angle may be internalized in the display panel DP. Accordingly, power consumption of the display panel DP may be reduced, a thickness of the display panel DP may be reduced, and a manufacturing cost of the display panel DP may be reduced.

Also, in case that the light transmitting film LTF is formed using an etching process to internalize the light blocking patterns LS in the display panel DP, the pad electrodes may be covered by the protective film PF. Accordingly, damage to the pad electrodes due to the etching process may be prevented. Accordingly, the reliability of the display device may be improved.

FIG. 22 is a schematic plan view illustrating pixels of a display device according to still another embodiment.

Referring to FIG. 22, the display device 30 may be substantially the same as the display device 10 described above with reference to FIGS. 1 to 11 or the display device described above with reference to FIGS. 12 to 21, except for the arrangement of the light blocking patterns LS.

In an embodiment, each of the light blocking patterns LS may be disposed to be spaced apart from the first to third sub pixels SPX1, SPX2, and SPX3 in plan view. Accordingly, the arrangement of the light blocking patterns LS may be further minimized. Accordingly, a decrease in luminance of the display panel DP may be further minimized.

The disclosure should not be construed as being limited to the embodiments set forth herein. Rather, these embodiments are provided so that this disclosure will be thorough and complete and will fully convey concepts of the disclosure to those skilled in the art.

While the disclosure has been particularly shown and described with reference to embodiments thereof, it will be understood by those of ordinary skill in the art that various changes in form and details may be made therein without departing from the spirit or scope of the disclosure.

What is claimed is:

1. A display device comprising:
a substrate including a display area and a pad area disposed outside the display area in plan view;
a plurality of pixels disposed in the display area on the substrate;
at least one display pad electrode disposed in the pad area on the substrate;
a thin film encapsulation layer disposed on the display area on the substrate and covering the plurality of pixels;
a protective film disposed on the thin film encapsulation layer and including an inorganic material;
a light transmitting film disposed on the protective film and including a plurality of openings exposing a portion of the protective film; and
a light blocking pattern that fills each of the plurality of openings and is disposed on the protective film, the light blocking pattern having an upper surface with a concave shape.

2. The display device of claim 1, wherein an etch rate of the protective film is lower than an etch rate of the light transmitting film in a same etching process.

3. The display device of claim 2, wherein the protective film includes at least one of silicon oxide, silicon nitride, and silicon oxynitride.

4. The display device of claim 1, wherein
each of the plurality of pixels includes a plurality of sub pixels, and
the light blocking patterns are spaced apart from the plurality of sub pixels in plan view.

5. The display device of claim 1, further comprising:
a transparent inorganic film pattern disposed in the display area on the light transmitting film wherein the plurality of openings overlap gaps within the transparent inorganic film pattern in a cross-sectional view.

6. The display device of claim 5, further comprising:
a sensing layer disposed between the thin film encapsulation layer and the protective film and including at least one touch electrode; and
at least one touch pad electrode disposed in the pad area on the substrate.

7. A method of manufacturing a display device, the method comprising:
forming a pixel in a display area on a substrate and at least one display pad electrode in a pad area disposed outside the display area in plan view;
forming a thin film encapsulation layer covering the pixel in the display area on the substrate;
forming a protective film including an inorganic material and covering the thin film encapsulation layer and the display pad electrode on the display area and the pad area on the substrate;
forming a light transmitting film including a plurality of openings exposing a portion of the protective film in the display area on the protective film; and
forming a light blocking pattern disposed in each of the plurality of openings.

8. The method of claim 7, wherein the forming of the light transmitting film includes:
forming a preliminary light transmitting film on the display area on the protective film;
forming a transparent inorganic film pattern on the preliminary light transmitting film;
forming a metal pattern covering an upper surface of the transparent inorganic film pattern and an upper surface of the protective film in the display area and the pad area on the substrate; and
forming the plurality of openings by etching the preliminary light transmitting film using the transparent inorganic film pattern and the metal pattern as a mask.

9. The method of claim 8, wherein in the etching the preliminary light transmitting film,
the protective film has a first etch rate and the preliminary light transmitting film has a second etch rate, and
the second etch rate is higher than the first etch rate.

10. The method of claim 9, wherein the protective film includes at least one of silicon oxide, silicon nitride, and silicon oxynitride.

11. The method of claim 8, wherein after forming the plurality of openings, the metal pattern is removed.

12. The method of claim 7, wherein after forming the light blocking pattern, the protective film in the pad area is selectively removed to expose the display pad electrode.

13. The method of claim 12, wherein the protective film in the pad area is selectively removed by a whole surface etching process.

14. A method of manufacturing a display device, the method comprising:
forming a pixel in a display area on a substrate and at least one display pad electrode in a pad area disposed outside the display area in plan view;
forming a thin film encapsulation layer covering the pixel in the display area on the substrate;

forming a sensing layer including at least one sensing electrode in the display area on the thin film encapsulation layer and at least one touch pad electrode disposed in the pad area;

forming a protective film, including an inorganic material, on the display area and the pad area on the substrate, the protective film covering the sensing layer, the display pad electrode, and the touch pad electrode;

forming a light transmitting film including a plurality of openings exposing a portion of the protective film in the display area on the protective film; and forming a light blocking pattern disposed in each of the plurality of openings.

15. The method of claim 14, wherein the forming of the light transmitting film includes:

forming a preliminary light transmitting film on the display area on the protective film;

forming a transparent inorganic film pattern on the preliminary light transmitting film;

forming a metal pattern covering an upper surface of the transparent inorganic film pattern and an upper surface of the protective film in the display area and the pad area on the substrate; and forming the plurality of openings by etching the preliminary light transmitting film using the transparent inorganic film pattern and the metal pattern as a mask.

16. The method of claim 15, wherein in the etching the preliminary light transmitting film, the protective film has a first etch rate and the preliminary light transmitting film has a second etch rate, and the second etch rate is higher than the first etch rate.

17. The method of claim 16, wherein the protective film includes at least one of silicon oxide, silicon nitride, and silicon oxynitride.

18. The method of claim 15, wherein after forming the plurality of openings, the metal pattern is removed.

19. The method of claim 14, wherein after forming the light blocking pattern, the protective film in the pad area is selectively removed to expose the display pad electrode and the touch pad electrode.

20. The method of claim 19, wherein the protective film in the pad area is selectively removed by a whole surface etching process.

\* \* \* \* \*